United States Patent

Nakao et al.

[11] Patent Number: 5,902,702
[45] Date of Patent: *May 11, 1999

[54] PHASE SHIFT MASK, BLANK FOR PHASE SHIFT MASK, AND METHOD OF MANUFACTURING PHASE SHIFT MASK

[75] Inventors: Shuji Nakao; Kouichirou Tsujita; Tatsunori Kaneoka, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,556

[22] Filed: Nov. 12, 1996

[30] Foreign Application Priority Data

May 15, 1996 [JP] Japan ................................. 8-120052

[51] Int. Cl.$^6$ ................................. G03F 9/00; B32B 9/00
[52] U.S. Cl. ................................. 430/5; 428/698
[58] Field of Search ................................. 428/698; 430/5

[56] References Cited

U.S. PATENT DOCUMENTS

| 5,284,724 | 2/1994 | Noelscher et al. ........................... 430/5 |
| 5,328,786 | 7/1994 | Miyazaki et al. ........................... 430/5 |
| 5,362,591 | 11/1994 | Imai et al. ................................. 430/5 |

FOREIGN PATENT DOCUMENTS

| 0493963 | 7/1992 | European Pat. Off. . |
| 0565473 | 10/1993 | European Pat. Off. . |
| 4-68352 | 3/1992 | Japan . |
| 4-365044 | 12/1992 | Japan . |
| 06095358 | 4/1994 | Japan . |
| 7-72612 | 3/1995 | Japan . |
| 07072612 | 3/1995 | Japan . |
| 7-92655 | 4/1995 | Japan . |
| 7-159971 | 6/1995 | Japan . |
| 07159971 | 6/1995 | Japan . |

OTHER PUBLICATIONS

C. Pierrat, et al: "Phase–Shifting Mask Topography Effects on Lithographic Image Quality", *SPIE*, vol. 1927 Optical/Laser Microlithography VI (1993), pp. 28–41.

Ahmad D. Katnani, et al: "Phase and Transmission Error Study for the Alternating–Element (Levenson) Phase–Shifting Mask", *SPIE*, vol. 1674 Optical/Laser Microlithography V (1992), pp. 264–270.

*Primary Examiner*—Mark Chapman
*Attorney, Agent, or Firm*—McDermott, Will & Emery

[57] ABSTRACT

A silicon nitride film and a silicon oxide film are deposited on a transparent substrate 1 to cover a first light transmitting region and to expose a second light transmitting region. A light blocking film is formed in a light blocking region sandwiched between the first and the second light transmitting regions Ta and Tn to cover the transparent substrate 1. A phase shift mask, a blank for a phase shift mask, and a method of manufacturing a phase shift mask are accordingly obtained in which the phase difference of the light transmitted through the light transmitting regions adjacent to each other with the light blocking film interposed is substantially 180° and the intensity of each transmitting light is identical.

18 Claims, 19 Drawing Sheets

THICKNESS OF SILICON NITRIDE FILM (Å)

THICKNESS OF SILICON OXIDE FILM (Å)

ELECTRIC FIELD ON MASK

LIGHT INTENSITY ON WAFER

ELECTRIC FIELD ON MASK

LIGHT INTENSITY ON WAFER

PHASE SHIFT MASK, BLANK FOR PHASE SHIFT MASK, AND METHOD OF MANUFACTURING PHASE SHIFT MASK

BACKGROUND OF THE INVENTION

1. Field of the Invention

The present invention relates to a phase shift mask, a blank for a phase shift mask, and a method of manufacturing a phase shift mask.

2. Description of the Background Art

As the higher integration and miniaturization have been achieved in a semiconductor integrated circuit, miniaturization of the circuit pattern formed on a semiconductor substrate (hereinafter simply referred to as a wafer) has also been promoted.

As a basic technique for the pattern generation, photolithography is widely known among others. Although various development and improvement have been proceeded in the field, the dimension of the pattern has been still smaller, and the requirement for the resolution of the pattern has also been stronger.

According to the photolithography technique, a mask (original) pattern is transferred to a photoresist coating a wafer, and an underlying film to be etched is patterned using the transferred photoresist. At the time of transfer, the photoresist is developed. Through the development process, the photoresist of the type in which a portion exposed to light is removed is called appositive type photoresist, while the type in which a portion not exposed to light is removed is called a negative type.

Resolution limit R (nm) in the photolithography employing the demagnification exposure method is represented as $$R = k_1 \cdot \lambda/(NA)$$

where $\lambda$ is wavelength (nm) of the light used, NA is numerical aperture of a lens, and $k_1$ is a constant dependent on the resist process.

As can be understood from above equation, in order to improve the resolution limit R to obtain a fine pattern, the values $k_1$ and $\lambda$ should be smaller, and the value NA should be larger. In other words, what is to be done is to reduce the constant dependent on the resist process and to shorten the wavelength and to increase NA.

However, improvement of light source or the lens is technically difficult, and depth of focus $\delta$ of the lens ($\delta = k_2 \cdot \lambda/(NA)^2$) might become shallower by shortening the wavelength and increasing NA, thus causing the deterioration of the resolution.

In view of this, studies of miniaturization of the pattern by improving not the light source or the lens but the photomask are proceeded. Lately, a phase shift mask has been attracting much attention as a photomask allowing improvement of the resolution of the pattern. The structure and principle of such a phase shift mask will be hereinafter described in comparison with an ordinary photomask. The description below will be directed to a phase shift mask of the Levenson system.

FIGS. 27A, 27B, and 27C respectively show a cross section of a mask, electric field on the mask, and light intensity on the wafer when an ordinary photomask is used. With reference to FIG. 27A, the ordinary photomask is structured to have a metal mask pattern 403 formed on a glass substrate 401. In the electric field on such an ordinary photomask, the pulse is modulated spatially by metal mask pattern 403 as shown in FIG. 27B.

Referring to FIG. 27C, if the pattern has smaller dimension, the exposure light transmitted through the photomask extends into a non-exposed region (a region where the transmission of the exposure light is blocked by metal mask pattern 403) on the wafer due to the diffraction effect of the light. The light is thus directed to the region not to be exposed on the wafer, resulting in deterioration of the contrast of the light (difference of the light intensity between an exposed region and a non-exposed region on a wafer). The resolution is degraded and transfer of a fine pattern becomes difficult.

FIGS. 28A, 28B and 28C respectively show a cross section of a mask, electric field on the mask, and light intensity on a wafer when a phase shift mask of the Levenson system is used. With reference to FIG. 28A, an optical member called a phase shifter 405 is provided on an ordinary photomask.

More specifically, chromium mask pattern 403 is formed on glass substrate 401 to provide an exposure region and a light blocking region, and phase shifter 405 is formed at every other exposure region. Phase shifter 405 has a function of shifting the phase of the transmitted light by 180°.

Referring to FIG. 28B, in the electric field on the mask generated by the light transmitted through the phase shift mask, the phases are alternately inverted by 180° since phase shifters 405 are provided at every other exposure region. As described above, adjacent exposed regions have opposite phases of light, so that beams of light are cancelled with each other due to the interference of light in the portions where reverse-phased beams of light are overlapped.

As a result, as shown in FIG. 28C, the intensity of the light becomes weak in the boundary portion between the exposed regions, then sufficient difference of light intensity between the exposed region and the non-exposed region on the wafer can be ensured. The improvement of the resolution is thus possible to allow the transfer of a fine pattern.

The phase shift mask of the Levenson system explained above has a superior resolution in view of this principle, and such system is considered as the most favorable system from the standpoint of resolving power among other various kinds of phase shift masks.

FIG. 29 schematically illustrates the cross section of the structure of the conventional phase shift mask of the Levenson system. With reference to FIG. 29, the conventional phase shift mask is provided with a transparent substrate 501 formed of quartz, an etching stopper layer 503 formed of SnO film, a phase shifter 505 formed of $SiO_2$ film, and a light blocking film 507 formed of Cr film.

Etching stopper film 503 is formed on transparent substrate 501. Phase shifter film 505 is formed to cover a first light transmitting region Ta and a light blocking region S and to expose a second light transmitting region Tn on etching stopper film 503. Light blocking film 507 is formed to cover transparent substrate 501 in light blocking region S located between adjacent first and second light transmitting regions Ta and Tn.

Generally, upon the exposure in the transfer process, the exposure light of uniform intensity is directed to the phase shift mask from the side of transparent substrate 501. The respective phases of the exposure light transmitted through the first light transmitting region Ta and the second light transmitting region Tn are inverted by 180°. The transmitted light with its phases inverted from each other is directed to the photoresist, and the pattern having a shape corresponding to light transmitting regions Ta and Tn is provided on the photoresist through the development.

If the first and the second light transmitting regions Ta and Tn have the same opening dimension, the same amount of light should be transmitted through each of light transmitting regions Ta and Tn in order to form a pattern of a photoresist of uniform dimension. However, in the conventional phase shift mask, the films are not appropriately structured in the first and the second light transmitting regions Ta and Tn, and the amount of light transmitted through the first and the second light transmitting regions Ta and Tn is not necessarily uniform.

Further, SnO used for etching stopper film 503 has a large refractive index. Therefore, the amount of light transmitted through the first and the second light transmitting regions Ta and Tn will be different even if the opening dimension of the first and the second transmitting regions Ta and Tn is large enough to cancel the effect of the shape generated by the processing. The pattern formed on the photoresist accordingly has different dimension as described above.

An invention aiming at overcoming this problem is shown in Japanese Patent Laying-Open No. 7-159971.

FIG. 30 schematically shows a cross section of the structure of the phase shift mask shown in the laid-open application. With reference to FIG. 30, a phase shifter film 205 is formed on a transparent substrate 201 with an etching stopper film 203 formed of alumina ($Al_2O_3$) interposed, and a light blocking film 207 is provided thereon to cover light blocking region S.

This approach aims at providing the same amount of light transmitted though the first and the second light transmitting regions Ta and Tn by adjusting the film thickness and the refractive index of phase shifter film 205.

In this structure, double layers of etching stopper layer 203 and phase shifter film 205 are provided on transparent substrate 201 in the first light transmitting region Ta. The amount of light transmitted through the first light transmitting region Ta is determined depending on the interaction between etching stopper layer 203 and phase shifter film 205. Therefore, the film thickness and the like are required to be adjusted for both of etching stopper layer 203 and phase shifter film 205 in order that the same amount of light is transmitted through the first and the second transmitting regions Ta and Tn.

As only phase shifter film 205 is considered in the technique shown in the patent, the amount of the light transmitted through the first and the second light transmitting regions Ta and Tn cannot be adjusted to be uniform.

A structure is disclosed in Japanese Patent Laying-Open No. 7-72612 in which etching stopper layer 203 of the structure shown in FIG. 30 is removed in the second light transmitting region Tn as shown in FIG. 31.

In the structures shown in FIGS. 30 and 31, a problem arises because of alumina used for etching stopper layer as described below.

Sputtering method is generally employed when a film is formed of alumina. In this case, metal is used as a target, and the sputtering ambient includes $O_2$ (Oxygen). A part of the target becomes insulated due to the ambient, and the discharge during the sputtering becomes unstable. Local arcing current is accordingly generated to cause melting and scattering of a portion of the target.

In the ordinary sputtering, atoms or molecules are deposited on a transparent substrate. In this case, a relatively large melted material drops on the transparent substrate. When such large melt drops on the transparent substrate, the large melt may repel a photoresist deposited thereon. When an aluminum film is etched, the large melt of alumina is difficult to be etched and removed completely. Further, the large melt of alumina makes it impossible to obtain a phase shift mask of higher resolution since the phase in the region containing the large melt of alumina is different from that in the other region.

Although a film can be formed of alumina by CVD (Chemical Vapor Deposition) method, temperature of 1000° C. or more is required. At such a high temperature, quartz as a material of transparent substrate 501 could distort, then a phase shift mask of higher resolution cannot be obtained when alumina is deposited by CVD method.

SUMMARY OF THE INVENTION

One object of the present invention is to provide a phase shift mask, a blank for a phase shift mask, and a method of manufacturing a phase shift mask in which the equal amount of light can be transmitted through respective light transmitting regions where light of different phases is transmitted.

Another object of the present invention is to provide a phase shift mask, a blank for a phase shift mask, and a method of manufacturing a phase shift mask which allows easier formation of a film and higher resolution.

A phase shift mask according to the present invention includes a first light transmitting region through which exposure light is transmitted, and a second light transmitting region adjacent to the first light transmitting region with a light blocking region interposed, through which exposure light of a phase different from that of the exposure light transmitted thorough the first light transmitting region is transmitted. The phase shift mask is provided with a transparent substrate, a silicon nitride film, a silicon oxide film, and a light blocking film. The transparent substrate has a major surface. The silicon nitride film is formed to cover the major surface of the transparent substrate in the first light transmitting region and to expose the major surface of the transparent substrate in the second light transmitting region. The silicon oxide film is deposited on the silicon nitride film to cover the major surface of the transparent substrate in the first light transmitting region and to expose the major surface of the transparent substrate in the second light transmitting region. The light blocking film covers the major surface of the transparent substrate in the light blocking region.

According to the first aspect of the present invention, the phase shift mask uses a silicon nitride film in stead of alumina. The silicon nitride film can be formed by CVD without setting the temperature very high. Different from the case in which alumina is formed by sputtering method, melted material of relatively large size never drops on the transparent substrate. The transparent substrate will never distort due to the temperature of 1000° C. or more, different from the case in which alumina is formed by CVD. A phase shift mask with few defects and high resolution can accordingly be obtained.

Preferably, according to the aspect described above, the silicon nitride film is formed directly attached to the major surface of the transparent substrate. The silicon oxide film is formed directly attached to the silicon nitride film.

Preferably, the aspect of the invention described above is characterized by the following equation:

$$(t_N \times n_N + t_0 \times n_0) - (t_N + t_0) = \frac{\lambda}{2} \times m$$

(m is any positive odd number)
where $t_N$ and $n_N$ respectively denote film thickness and refractive index of silicon nitride film, and $t_0$, $n_0$ and $\lambda$ respectively denote film thickness and refractive index of silicon oxide film and wavelength of exposure light. In the aspect described above, the arbitrary positive odd number is 1.

Preferably, according to the aspect of the invention, the film thickness and the refractive index of the silicon oxide film are respectively 240±108 Å and 1.47±0.03, and those of the silicon nitride film are respectively 1570±47 Å and 2.09±0.03 provided that the exposure light is i-line.

Preferably according to the aspect of the invention, the film thickness and the refractive index of the silicon oxide film are respectively 440±67 Å and 1.51±0.03, and those of the silicon nitride film are respectively 800±26 Å and 2.27±0.04 provided that the exposure light is KrF excimer light.

According to the five preferred aspects of the invention described above, the phases of the light transmitted through adjacent light transmitting regions with a light blocking region interposed substantially differ by 180° and the equal amount of light can be transmitted through those transmitting regions. A highly precise phase shift mask can thus be obtained.

A phase error caused by the overetching can be made smaller, and the prevention of the peeling of the pattern during a process such as cleaning as well as the decrease of the amount of the transmitted light due to a geometric effect can be achieved, since the total thickness of the silicon nitride film and the silicon oxide film can be decreased.

A phase shift mask according to another aspect of the present invention includes a first light transmitting region through which exposure light is transmitted, and a second light transmitting region adjacent to the first light transmitting region with a light blocking region interposed, through which exposure light of a phase different from that of the exposure light transmitted through the first light transmitting region is transmitted. The phase shift mask is provided with a transparent substrate, a silicon nitride film, a silicon oxide film, and a light blocking film. The transparent substrate has a major surface. The silicon nitride film is formed to cover the major surface of the transparent substrate in the first light transmitting region and to expose the major surface of the transparent substrate in the second light transmitting region. The silicon oxide film is formed on the silicon nitride film to cover the major surface of the transparent substrate in the first light transmitting region and to cover the major surface of the transparent substrate in the second light transmitting region. The light blocking film covers the major surface of the transparent substrate in the light blocking region.

The phase shift mask according to another aspect of the present invention uses the silicon nitride film instead of alumina as in the first aspect of the present invention, so that a phase shift mask with few defects and higher resolution can be obtained.

Preferably, according to the aspect described above, the film thickness and refractive index of the silicon oxide film are respectively 650±150 Å and 1.47±0.03, and the film thickness and refractive index of the silicon nitride film are respectively 1680±47 Å and 2.09±0.03 provided that the exposure light is i-line.

Preferably, according to the aspect of the invention described above, the film thickness and refractive index of the silicon oxide film are respectively 420±100 Å and 1.47±0.03, and the film thickness and refractive index of the silicon nitride film are respectively 980±26 Å and 2.27±0.04 provided that the exposure light is KrF excimer light.

According to the two preferred aspects of the invention, each phase of the light transmitted through adjacent light transmitting regions with a light blocking region interposed substantially differs by 180° C., and the amount of the transmitted light can be set equal. A highly precise phase shift mask can accordingly be obtained.

A blank for a phase shift mask according to the present invention includes a first light transmitting region through which exposure light is transmitted, and a second light transmitting region adjacent to the first light transmitting region with a light blocking region interposed, through which exposure light of a phase different from that of the exposure light transmitted through the first light transmitting region is transmitted. The blank is provided with a transparent substrate, a silicon nitride film, a silicon oxide film, and a light blocking film. The transparent substrate has a major surface. The silicon nitride film is formed directly attached to the major surface of the transparent substrate. The silicon oxide film is formed directly attached to the silicon nitride film. The light blocking film is formed directly attached to the silicon oxide film. The blank satisfies the following equation:

$$(t_N \times n_N + t_0 \times n_0) - (t_N + t_0) = \frac{\lambda}{2} \times m$$

(m is any positive odd number)
where $t_N$ and $n_N$ respectively denote film thickness and refractive index of the silicon nitride film, and $t_0$ and $n_0$ respectively denote film thickness and refractive index of the silicon oxide film, and λ denotes wavelength of the exposure light. Preferably, according to the aspect described above, arbitrary positive odd number m in the equation is 1.

Preferably, according to the aspect described above, the film thickness and refractive index of the silicon oxide film are respectively 240±108 Å and 1.47±0.03, and the film thickness and the refractive index of the silicon nitride film are respectively 1570±47 Å and 2.09±0.03 provided the exposure light is i-line.

Preferably, according to the aspect described above, the film thickness and refractive index of the silicon oxide film are respectively 440±67 Å and 1.51±0.03 and those of the silicon nitride film are respectively 800±26 Å and 2.27±0.04 provided the exposure light is KrF eximer light.

According to the blank for the phase shift mask and the preferred four aspects of the present invention, each phase of the light transmitted through adjacent light transmitting regions with a light blocking region interposed is substantially different from each other by 180°, and the amount of the transmitted light can be made equal by fabricating a phase shift mask using this blank for the phase shift mask. A highly precise phase shift mask can be obtained.

A method of manufacturing a phase shift mask which is provided with a first light transmitting region through which exposure light is transmitted, and a second light transmitting region adjacent to the first light transmitting region with a light blocking region interposed, through which exposure light of a phase different from that of the exposure light transmitted through the first light transmitting region is transmitted, includes following process steps.

The silicon nitride film, and then the silicon oxide film are formed on the major surface of the transparent substrate. The light blocking film is formed to cover the silicon oxide film in the light blocking region and to expose the silicon oxide film in the first and the second light transmitting regions. The surface of the silicon oxide film is isotropically etched to expose the surface of the silicon nitride film with the surface of the silicon oxide film in the second light transmitting region exposed. The exposed surface of the silicon nitride film is anisotropically etched and a trench with its bottom wall formed of the silicon nitride film is provided. The inner wall of the trench is isotropically etched using heated solution of phosphoric acid to expose the surface of the transparent substrate in the bottom wall of the trench.

According to another aspect of the present invention, a method of manufacturing a phase shift mask which is provided with a first light transmitting region through which exposure light is transmitted, and a second light transmitting region adjacent to the first light transmitting region with a light blocking region interposed, through which exposure light of a phase different from that of the exposure light transmitted through the first light transmitting region is transmitted, includes following process steps.

The silicon nitride film is formed on the major surface of the transparent substrate. The surface of the silicon nitride film is anisotropically etched using heated phosphoric acid solution to expose the surface of the transparent substrate with the surface of the silicon nitride film in the second light transmitting region exposed. The silicon oxide film is formed to cover the silicon nitride film in the first light transmitting region and to cover the exposed major surface of the transparent substrate in the second light transmitting region. The light blocking film is formed to cover the silicon oxide film in the light blocking region and to expose the silicon oxide film in the first and the second light transmitting regions.

In the method of manufacturing a phase shift mask according to the two aspects of the invention, a silicon nitride film is used instead of alumina. A phase shift mask with few defects and higher resolution can be fabricated as described above.

Each phase of the light transmitted through adjacent light transmitting regions with a light blocking region interposed is substantially different from each other by 180°, and the amount of the light transmitted through each region can be made equal. Thus, a highly precise phase shift mask can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiment of the present invention is hereinafter described according to the attached drawings.

First Embodiment

Figure 1:
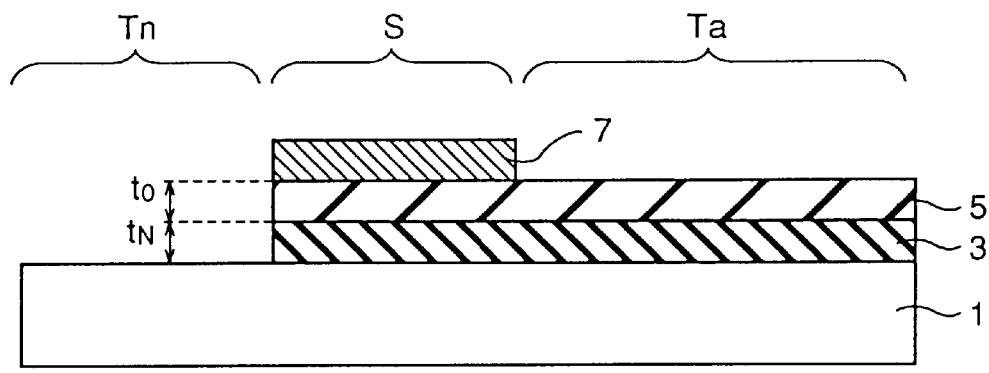
FIG. 1 is a schematic cross section illustrating the structure of the phase shift mask according to the first embodiment of the present invention.

With reference to FIG. 1, the phase shift mask according to this embodiment is provided with a transparent substrate 1, a silicon nitride film 3, a silicon oxide film 5, and a light blocking film 7.

Transparent substrate 1 is formed, for example, of quartz. Silicon nitride film 3 and silicon oxide film 5 are deposited on transparent substrate 1 to cover the first light transmitting region Ta and to expose the second light transmitting region Tn. Light blocking film 7 is provided on transparent substrate 1 to cover light blocking region S and to expose the first and second light transmitting regions Ta and Tn.

It is noted that silicon nitride film 3 and silicon oxide film 5 may cover light blocking region S on transparent substrate 1. In this case, light blocking film 7 may be formed on silicon oxide film 5, or formed between silicon nitride film 3 and transparent substrate 1.

Preferably, film thickness $t_N$ of silicon nitride film 3 is 1570±47 Å and film thickness $t_O$ of silicon oxide film 5 is 240±108 Å when i-line (wavelength: 365 nm) is used as exposure light. In this case, preferably, refractive index $n_N$ of silicon nitride film 3 is 2.09±0.03, and refractive index $n_O$ of silicon oxide film 5 is 1.47±0.03.

When KrF eximer light (wavelength: 248 nm) is used as exposure light, it is preferable that film thickness $t_N$ of silicon nitride film 3 is 800±26 Å and film thickness to of silicon oxide film 5 is 440±67 Å. In this case, preferably, refractive index $n_N$ of silicon nitride film 3 is 2.27±0.04 and refractive index $n_O$ of silicon oxide film 5 is 1.51±0.03.

The amount (intensity) of light transmitted in each of the first and second transmitting regions Ta and Tn shown in FIG. 1 can be almost the same and the phase difference of the transmitted light in the first light transmitting regions Ta and the second light transmitting region Tn can be substantially 180° by setting the film thickness of silicon nitride film 3 and silicon oxide film 5 as described above. More detailed description on this point will be hereinafter given.

Figure 2:
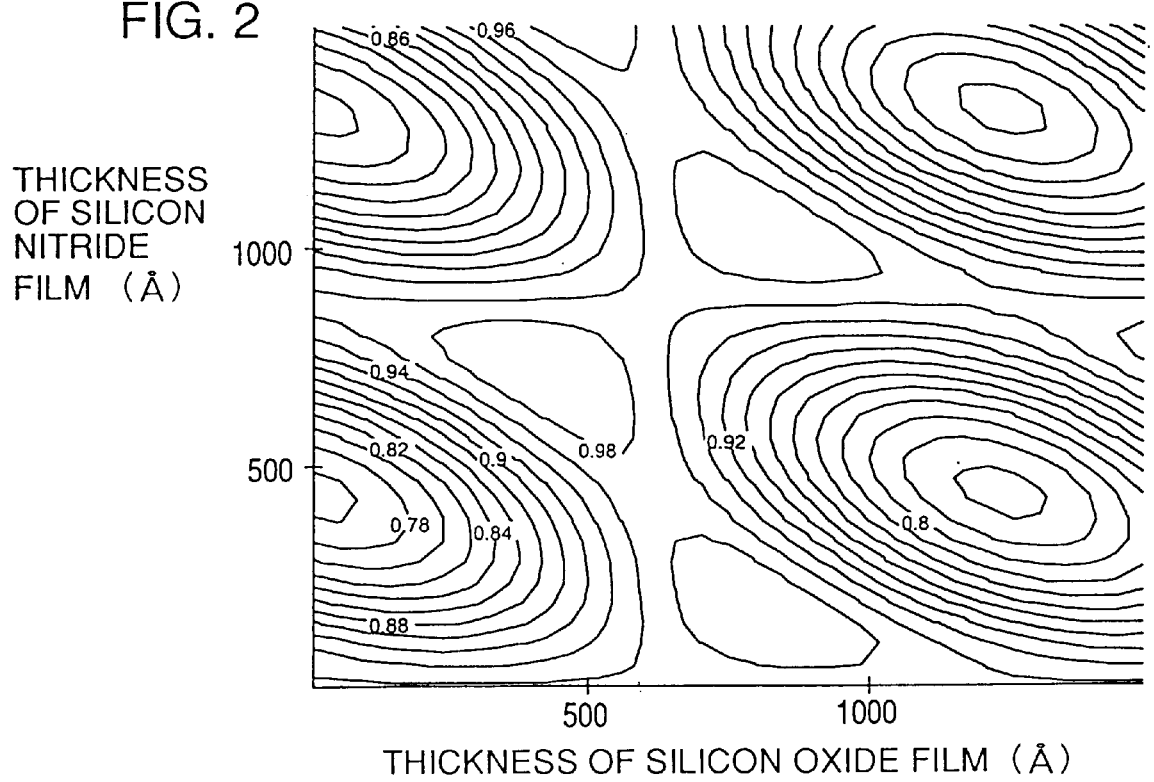
FIG. 2 shows the contours of the transmittance in the first light transmitting region Ta simulated varying the film thickness of the silicon nitride film and the silicon oxide film of the phase shift mask shown in FIG. 1 and using i-line as exposure light.

With reference to FIG. 2, the simulation shown in FIG. 2 is performed forming silicon nitride film 3 and silicon oxide film 5 in FIG. 1 according to the following method. Silicon nitride film 3 is formed of the material $SiCl_2H_2$ and $NH_3$ at 700° C. following LPCVD (Low Pressure Chemical Vapor Deposition). Silicon oxide film 5 is formed of the material $SiH_4$ and $N_2O$ at 800° C. according to LPCVD. The real part n and the imaginary part k of each refractive index of thus formed silicon nitride film 3 and silicon oxide film 5 for i-line are n=2.09 and k=0.000 in the case of silicon nitride film 3, and n=1.47 and k=0.000 for silicon oxide film 5. The values of the refractive index are the actually measured ones according to ellipsometry.

It is understood from FIG. 2 that the transmittance is varied with the change of the film thickness of the silicon oxide film and the silicon nitride film when those films are stacked on the transparent substrate. When one of the film thickness of the silicon oxide film and the silicon nitride film is fixed and the other is varied, the peak and the bottom values of the transmittance depend on the fixed film thickness, but periodically change with the varied film thickness. This variation makes it possible to obtain almost the same transmittance as that in the region without a film formed on the transparent substrate (light transmitting region Tn in FIG. 1) by appropriately selecting each film thickness of silicon oxide film and silicon nitride film.

On the other hand, when the silicon oxide film and the silicon nitride film are utilized as phase shifters in the Levenson system type phase shift mask, it is necessary that the phase difference of the light transmitted through the first light transmitting region Ta and second light transmitting region Tn is substantially 180°. Following equation (1) shows the requirement for satisfying the phase difference of almost 180° for respective film thicknesses $t_N$ and $t_O$ and refractive indexes $n_N$ and $n_O$ of silicon nitride film 3 and silicon oxide film 5 shown in FIG. 1. It is noted that $n_{air}$ is the refractive index of the atmosphere which normally has the value of 1.

$$(t_N \times n_N + t_O \times n_O) - (t_N + t_O)n_{air} = \frac{\lambda}{2} \times m \quad (1)$$

(m is arbitrary positive odd number)

A desired film structure having a necessary characteristic can be obtained by calculating the film thickness of the silicon nitride film and the silicon oxide film satisfying the equation (1) and allowing the same transmittance in the first light transmitting region Ta and the second light transmitting region Tn in FIG. 1.

Figure 3:
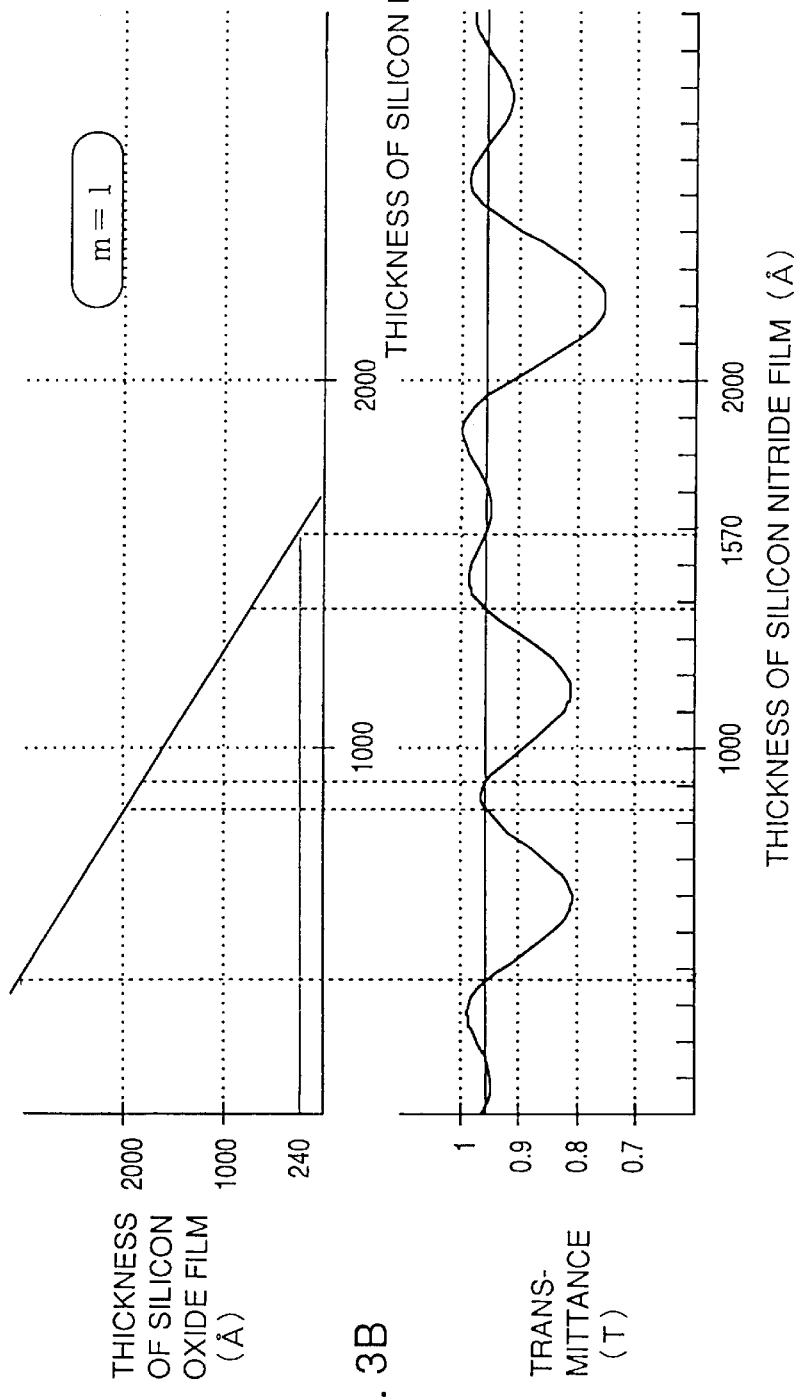
FIG. 3A is a graphical representation of the relation between the film thickness of the silicon nitride film and that of the silicon oxide film when the phase difference between the first and the second light transmitting regions Ta and Tn in FIG. 1 is 180°.
FIG. 3B is a graphical representation of the relation between the film thickness of the silicon nitride film and the transmittance T.

FIG. 3A shows the relation between the thickness of the silicon nitride film and that of the silicon oxide film satisfying the equation (1) and FIG. 3B shows the relation between the film thickness and the transmittance of the silicon nitride film when the film thickness of the silicon nitride film and that of the silicon oxide film are changed so that they satisfy the equation (1).

FIG. 3B shows the level of the transmittance (96%) of transparent substrate 1 alone, which is formed of quartz. The intersections of the line of the 96% level and the transmittance curve show that the transmittance of the first light transmitting region Ta and that of the second light transmitting region Tn in FIG. 1 have the identical value.

The first light transmitting region Ta and the second light transmitting region Tn in FIG. 1 having the same transmittance and the phases different from each other by 180° can be obtained by selecting the film thickness of silicon nitride film 3 and silicon oxide film 5 corresponding to these intersections.

Considering the actual process of manufacturing, the sum of the thickness of silicon nitride film 3 and silicon oxide film 5 in FIG. 1 is desirably smaller. The reason is as follows.

If a film to be etched is completely removed by etching, approximately 20–30% of the thickness of the film to be etched is overetched. The purpose of this overetching is to prevent residue and to prevent a generation of a defect of a phase shift mask due to the residue. When the sum of the thickness of silicon nitride film 3 and silicon oxide film 5 increases, the overetched amount in the etching performed for these two layers also increases. In other words, the etched amount of transparent substrate 1 increases at the time of removal of silicon nitride film 3 and silicon oxide film 5. Therefore, the transparent substrate is removed by etching more than necessary in the second light transmitting region Tn where silicon nitride film 3 and silicon oxide film 5 are removed. The phase error due to the overetching between the first light transmitting region Ta and the second transmitting region Tn becomes large.

When the sum of the thickness of silicon nitride film 3 and silicon oxide film 5 becomes large, the aspect ratio (height/width) of the pattern constituted by the stacked structure of these two layers 3 and 5 will also increases. This increase makes the cleaning difficult since the pattern peels easily during the cleaning process.

The increase of the thickness of silicon nitride film 3 and silicon oxide film 5 significantly reduces the transmittance of the light transmitted through the first light transmitting region Ta in FIG. 1 due to the geometric effect.

Considering these outcomes, the sum of the film thickness of silicon nitride film 3 and silicon oxide film 5 is preferably small. In order to decrease the sum of the film thickness, the film thickness of silicon nitride film 3 having higher refractive index should have the maximum value in view of FIGS. 3A and 3B. Specifically, film thickness $t_N$ of silicon nitride film 3 is 1570 Å and film thickness $t_O$ of silicon oxide film 5 is 240 Å as shown in FIGS. 3A and 3B. At this time, the entire film thickness of silicon nitride film 3 and silicon oxide film 5 is 1810 Å, allowing the decrease of the step less than half of that formed when the thickness of the conventional shifter film is 4000 Å.

The tolerance of the film thickness is next examined.

1. The tolerance of the film thickness is examined considering only the difference of the intensity of the transmitted light.

At the time of transfer in the fabrication of LSI (Large Scale Integrated Circuit), it is usually required that the variation of the resist dimension is below 10% when the exposure amount is varied 10%. To this end, the process is designed such that the resist dimension does not significantly vary even when there is variation in exposure amount of the stepper, the sensitivity of the resist, and the reflection of the substrate, for example. Since the variation of the entire dimension of the resist is within 10%, the difference in dimension between the resist pattern corresponding to the first light transmitting region Ta and that corresponding to the second light transmitting region Tn in FIG. 1, in other words, the difference in dimension derived from presence/absence of the shifter should be within the range of ±2%. In order to make the difference in dimension derived from presence/absence of the shifter within ±2% under this condition, the difference of the intensity of the transmitted light in the first light transmitting region Ta and the second transmitting region Tn may be within the range of ±5%.

Considering only the difference of the intensity of the transmitted light, film thickness $t_N$ of silicon nitride film 3 is between 1320Å and 1970 Å and film thickness $t_O$ of silicon oxide film 5 is between 0 Å and 840 Å for i-line according to FIG. 3B.

2. The tolerance of the film thickness is examined considering only the phase difference.

In this case, as for the tolerance of the variation of the resist dimension derived from presence/absence of the shifter, the maximum difference of the resist dimension due to the existence of the shifter is within the range of ±2% for the focus range of 1.5 μm. The result of the experiment of the transfer revealed that if the phase difference is within the range of±5°, the tolerance of the resist dimension variation is satisfied. The phase difference is based simply on the ratio of the variation of the film thickness, so that the tolerance of the film thickness can be obtained following the formula: film thickness t x (±5°/180°). As a result, film thickness $t_N$ of silicon nitride film 3 is 1570±44 Å, and film thickness to of silicon oxide film 5 is 240±7 Å for i-line.

The tolerance of the film thickness is calculated considering the phase difference generated when the film thickness of silicon nitride film 3 and silicon oxide film 5 varies in the same direction and at the same ratio. Therefore, film thickness $t_N$ of silicon nitride film 3 is 1570±47 Å and film thickness $t_O$ of silicon oxide film 5 is 240±108 Å when $t_N$ of silicon nitride film 3 is fixed at a desired value and $t_O$ of silicon oxide film 5 is varied.

Following above considerations 1 and 2, film thickness $t_N$ of silicon nitride film 3 is 1570±47 Å and to of silicon oxide film 5 is 240±108 Å considering the overlapping range of the film thickness of silicon nitride film 3 and silicon oxide film 5. Accordingly, the amount of each transmitted light through light transmitting regions Ta and Tn adjacent to each other with a light blocking region S interposed in FIG. 1 is identical and the phase of each transmitted light substantially differs 180° from each other if the film thickness is within above described range. The decrease in the sum of the thickness of the silicon nitride film and the silicon oxide film allows the decrease of the phase error due to overetching, prevents peeling of the pattern during the process such as cleaning, and prevents decrease of the amount of transmitted light due to the geometric effects.

It is noted that refractive index $n_N$ of silicon nitride film 3 is 2.09±0.03 and refractive index $n_O$ of silicon oxide film 5 is 1.47±0.03 for i-line.

Figure 4:
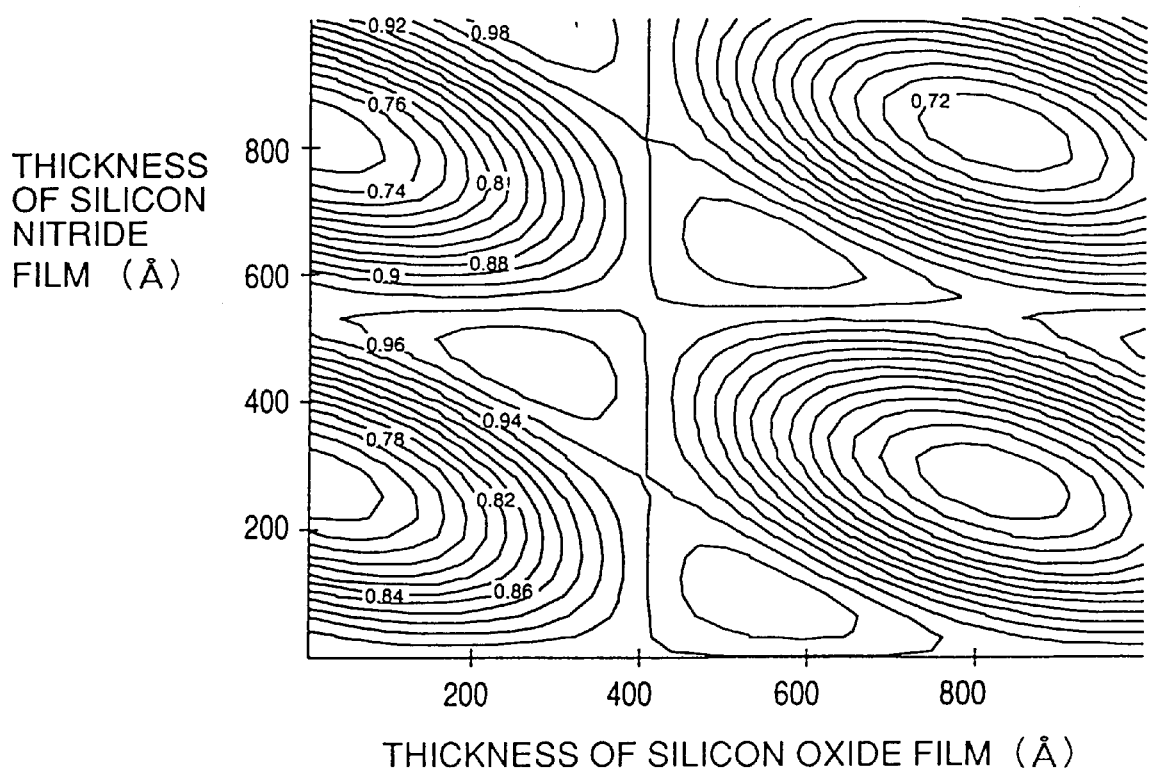
FIG. 4 shows the contours of the transmittance simulated varying the film thickness of the silicon nitride film and the silicon oxide film in FIG. 1 and using KrF eximer light as exposure light.
Figure 5A:
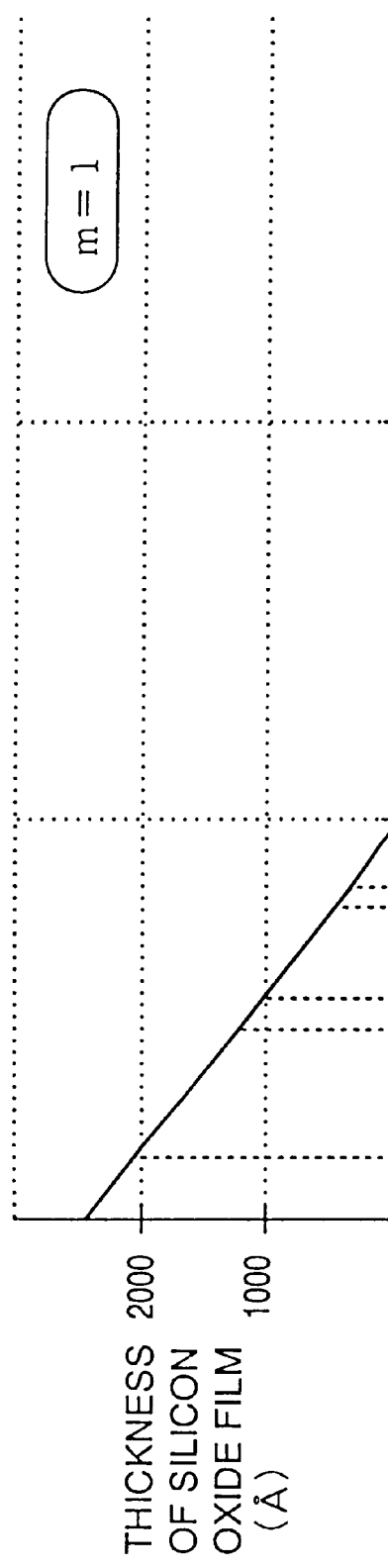
FIG. 5A is a graphical representation of the relation between the film thickness of the silicon nitride film and that of the silicon oxide film when the phase difference of the transmitted light in the first and second light transmitting regions Ta and Tn in FIG. 1 is 180°.
Figure 5B:
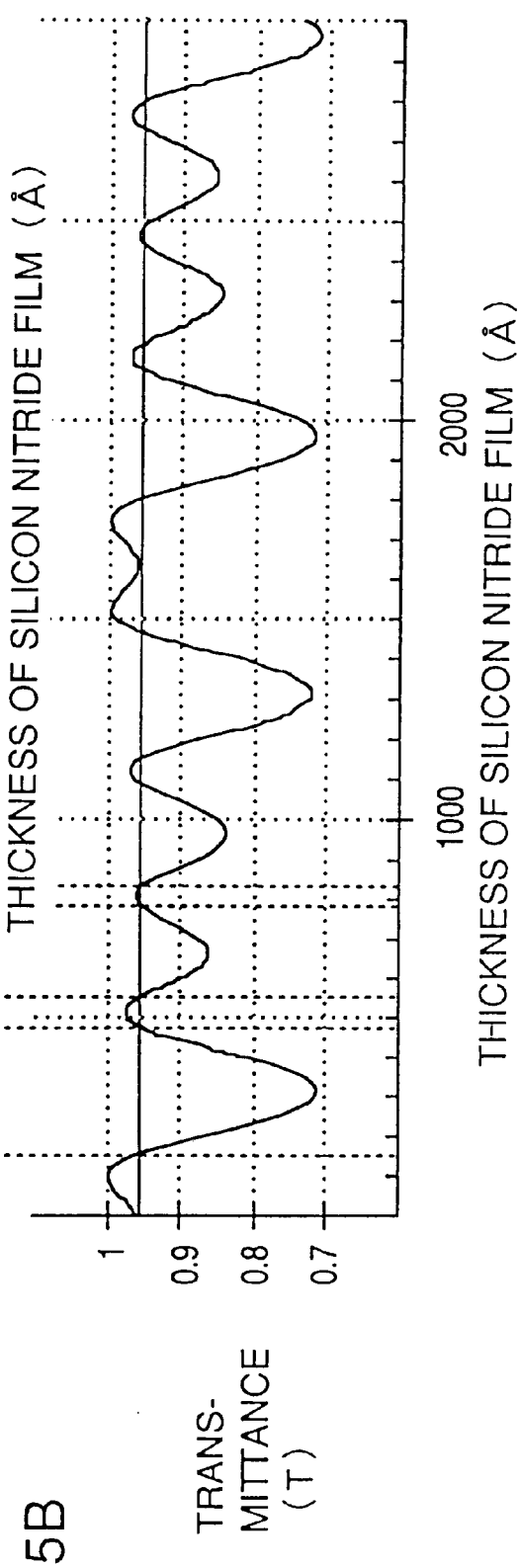
FIG. 5B is graphical representation of the relation between the film thickness of the silicon nitride film and transmittance T.

Referring to FIGS. 4, 5A and 5B, the tolerance of the film thickness of silicon nitride film 3 and silicon oxide film 5 is examined when KrF eximer light is used as exposure light following the similar procedure to that used for i-line.

3. When only the difference of the intensity of the transmitted light is considered as above, film thickness $t_N$ of silicon nitride film 3 is between 740 Å and 870 Å, and $t_O$ of silicon oxide film 5 is between 260 Å and 580 Å.

4. When only the difference of the phase is considered, and film thickness $t_N$ and $t_O$ of silicon nitride film 3 and silicon oxide film 5 change in the same direction and at the same ratio, $t_N$ of silicon nitride film 3 is 800±22 Å and to of silicon oxide film 5 is 440±11 Å.

When the difference of the phase is considered, and film thickness $t_O$ of silicon oxide film 5 is varied with film thickness $t_N$ of silicon nitride film 3 fixed at a desired value, $t_N$ of silicon nitride film 3 is 800±26 Å and $t_O$ of silicon oxide film 5 is 440±67 Å.

Following the consideration described in above items 3 and 4, $t_N$ of silicon nitride film 3 is 800±26 Å and $t_O$ of silicon oxide film 5 is 440±67 Å taking the overlapping range of the film thickness. Within this range of the film thickness, the light transmitted through light transmitting regions Ta and Tn adjacent to each other with light blocking region S interposed in FIG. 1 is identical in amount and the phases thereof can substantially differ 180° as in the case of i-line. The decrease in sum of the film thicknesses as of silicon nitride film 3 and silicon oxide film 5 also decreases the phase error due to overetching, prevents peeling of the pattern during a process such as cleaning, and prevents decrease of the intensity of the transmitted light due to the geometric effect.

It is noted that the refractive index $n_N$ of silicon nitride film 3 is 2.27±0.04 and $n_O$ of silicon oxide film 5 is 1.51±0.03.

The tolerance of the film thickness described above is applied to the case in which m=3 as well as m=1 in the equation (1). The relation between the film thickness of the silicon nitride film and that of the silicon oxide film, and the relation of the film thickness of the silicon nitride film and transmittance T when m=3 are as shown in FIGS. 6A and 6B.

Figure 6A:
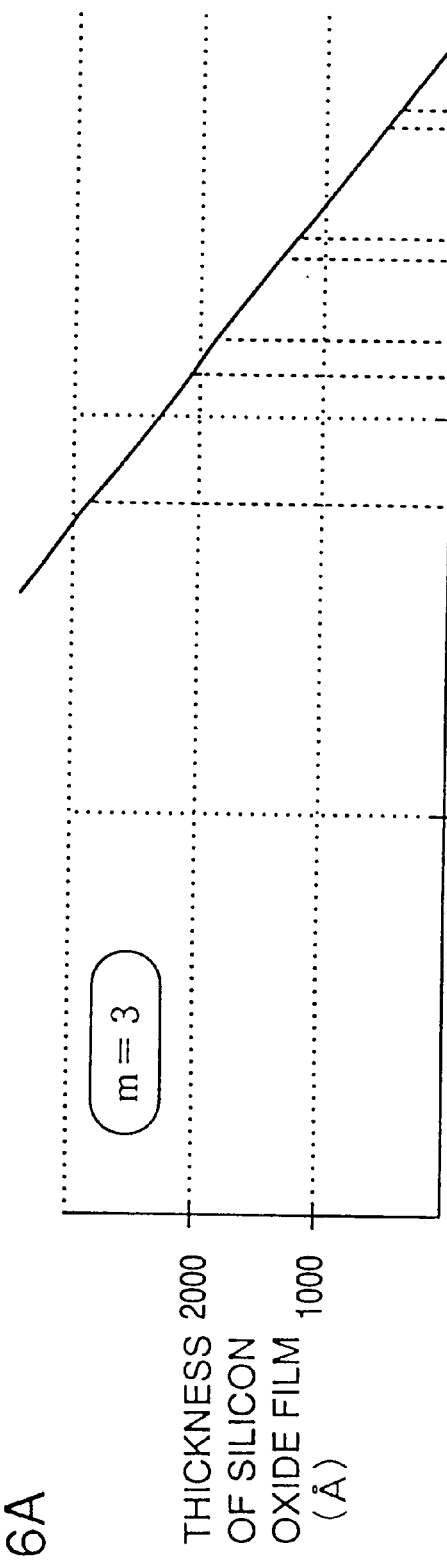
FIG. 6A is a graph showing the relation between the film thickness of the silicon nitride film and that of the silicon oxide film when the phase difference of the transmitted light in the first and second light transmitting regions Ta and Tn is 180°.
Figure 6B:
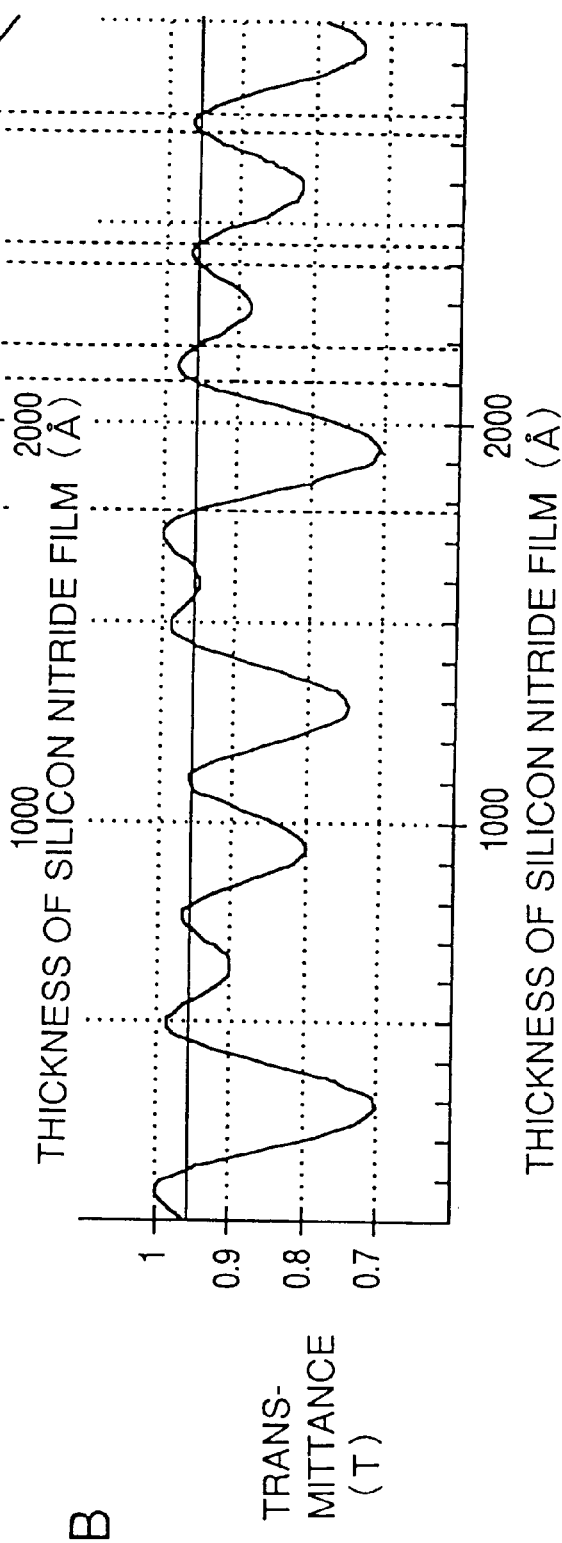
FIG. 6B is a graph showing the relation between the film thickness of the silicon nitride film and transmittance T.

Comparing FIGS. 6A and 5A, it can be understood that the sum of the film thickness of the silicon nitride film and that of the silicon oxide film is larger when m is 1 than when m is 3. In order to reduce the step generated due to the stacked films of the silicon nitride film and the silicon oxide film in the phase shift mask, m is preferably 1 in equation (1).

According to the phase shift mask of the embodiment shown in FIG. 1, the stacked films of silicon nitride film 3 and silicon oxide film 5 are used. Therefore, the residual defect of the shifter can be easily and accurately repaired and the residual defect can also be correctly detected as described in detail below.

Figure 7:
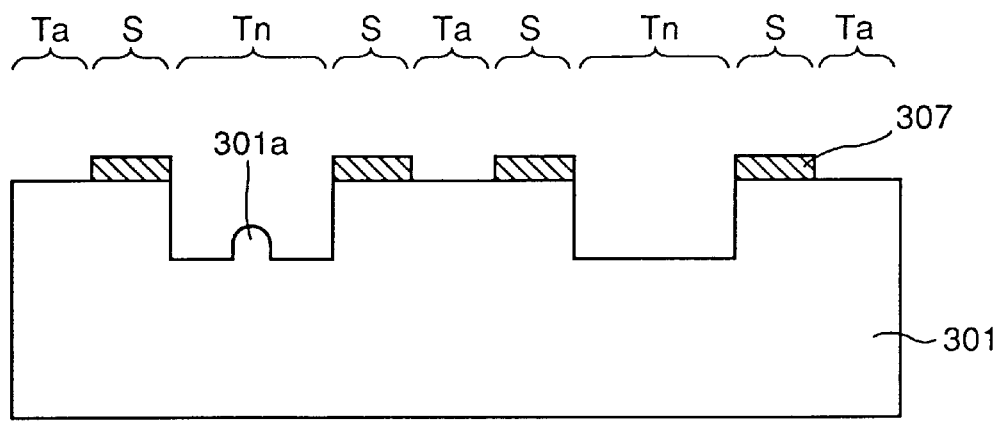
FIGS. 7 and 8 respectively show the first and the second process steps for describing the problem of the residual defect occurred when the phase shifter portion and the transparent substrate are integrally formed of the identical material.

As shown in FIG. 7, in the phase shift mask in which a phase shifter portion 301 and a transparent substrate 301 are integrally formed, a shifter residual defect 301a would be of the same material as that of transparent substrate 301.

The most effective method now proposed for repairing the shifter residual defect is gas assisted FIB (Focussed Ion Beam). This method is characterized by the local etching using gas such as xenon fluoride (XeF) flowing therethrough and directing gallium (Ga) ion beam having its beam diameter reduced to shifter residual defect 301a.

Figure 8:
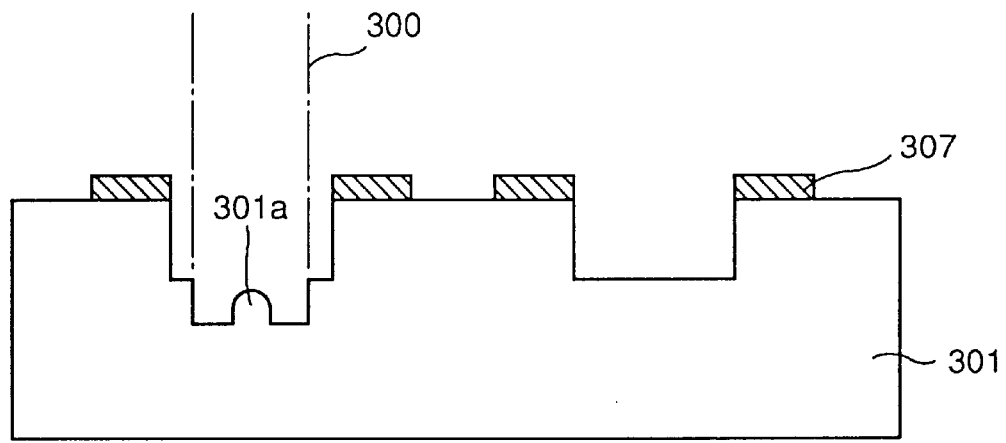

As shown in FIG. 7, when the phase shifter portion and transparent substrate 301 are formed of the same material, in principle, there cannot be etch selectivity between shifter residual defect 301a and transparent substrate 301. Therefore, if an ion beam 300 is directed as shown in FIG. 8, even the normal substrate portion other than shifter residual defects 301a is etched. To accurately stop the etching by ion beam 300 would be difficult since, in principle, there is not the etch selectivity between shifter residual defect 301a and substrate 301. Practical use of this method would be difficult because of many disadvantages such as the large phase error.

Figure 9:
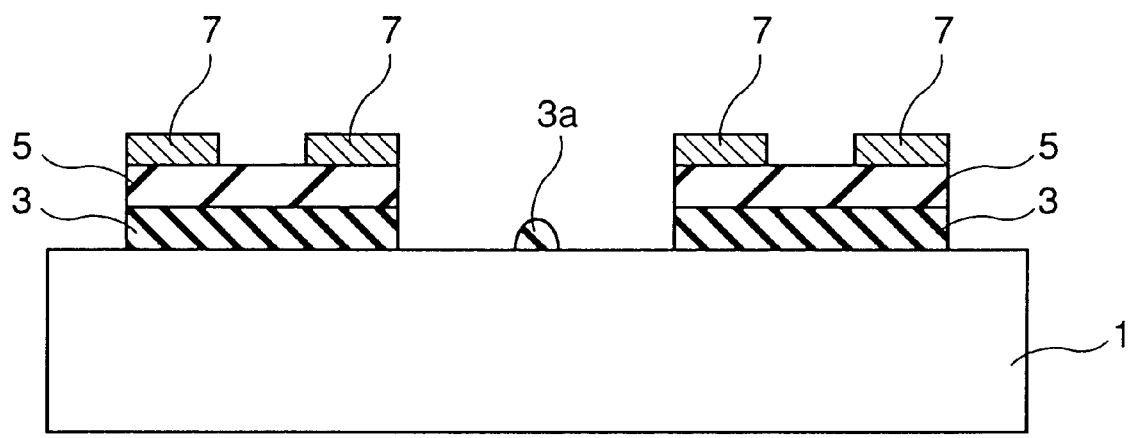
FIG. 9 is a schematic cross section showing how to solve the problem of the residual defect in the phase shift mask according to the first embodiment of the invention.

On the other hand, in the phase shift mask according to this embodiment, the phase shifter is constituted by silicon nitride film 3 and silicon oxide film 5 formed of material different from that of transparent substrate 1. As shown in FIG. 9, even if there is residual defect 3a of the phase shifter, etching of transparent substrate 1 and shifter residual defect 3a of high etching selectivity is possible using gas of CF type such as $CHF_3$, $CF_4$, $C_2F_8$ as the gas employed in the gas assisted FIB. According to the structure of the phase shift mask of this embodiment, the defect can be more easily and accurately repaired as compared with the conventional method shown in FIGS. 7 and 8.

Figure 10:
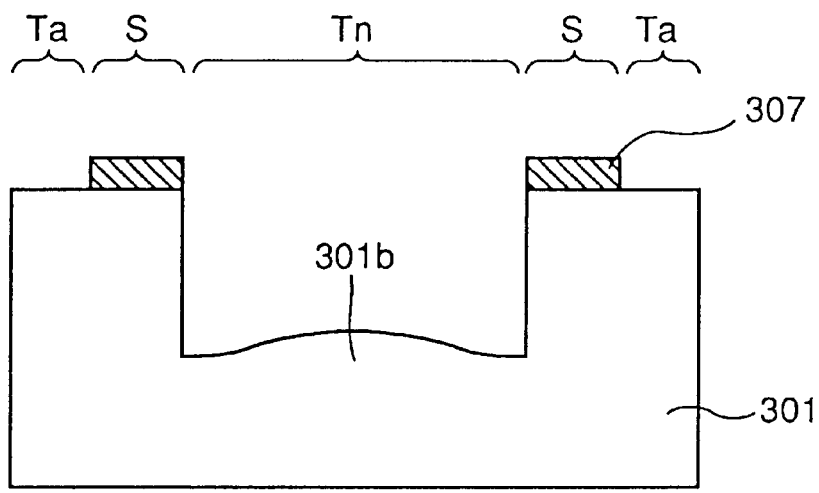
FIG. 10 is a schematic cross section showing the problem due to the relatively smooth residual defect.

Referring to a conventional phase shift mask shown in FIG. 10, a shifter residual defect 301b may be of relatively smooth shape with no edge when the shifter portion and the transparent substrate are integrally formed. In this case, shifter residual defect 301b cannot be detected since there is no attenuation of light caused by the scattering thereof in the microscopic image of the defect inspection apparatus, so that the contrast of shifter residual defect 301b is not present in the microscopic image.

On the other hand, in the phase shift mask according to this embodiment, shifter residual defect 3a is formed of the silicon nitride film of material different from that of transparent substrate 1 as shown in FIG. 9.

Figure 11:
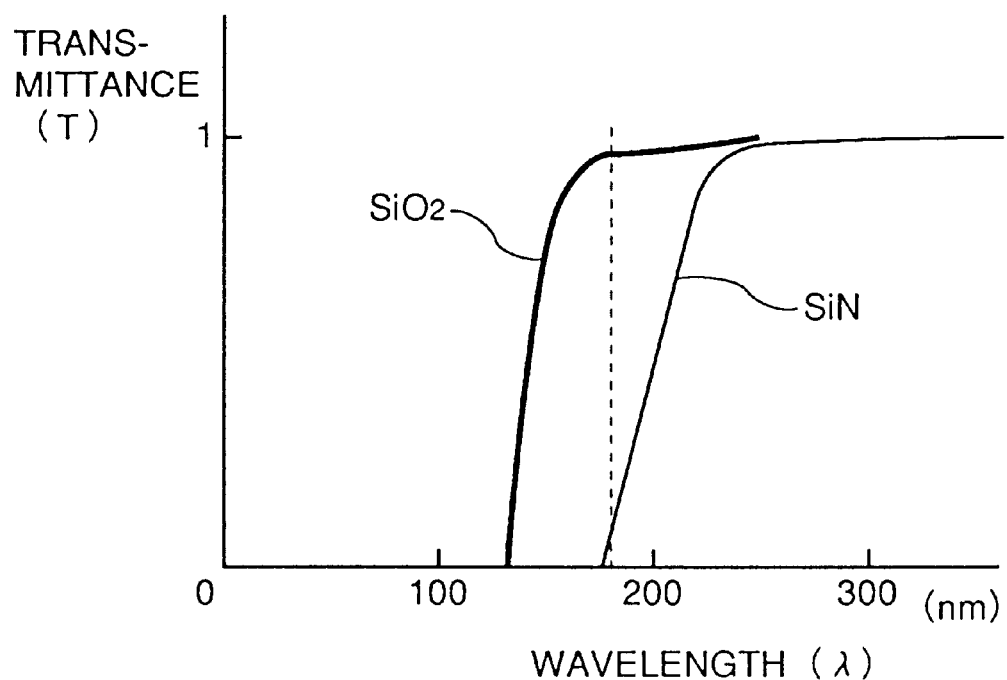
FIG. 11 is a graphical representation of the relation between wavelength λ and transmittance T of the silicon oxide film and silicon nitride film.

The transmittance of the silicon nitride film sharply when the wavelength is 200 nm or less, while the transmittance of the silicon oxide film is sufficient when the wavelength is up to 170 nm as shown in FIG. 11. When a defect inspection is performed using the transmitted light with its wavelength of 170–200 nm, the region where shifter residual defect 3a of silicon nitride film exists is sufficiently dark to provide enough contrast between the region and the region where the defect 3a does not exist even if shifter residual defect 3a shown in FIG. 9 is smoothly formed.

The detection of a shifter residual defect having smoothly formed surface becomes possible in the structure of the phase shift mask according to this embodiment, by performing a defect inspection using the light of 170–200 nm wavelength.

One of the methods of manufacturing a phase shift mask according to this embodiment will be next described.

Figure 12:
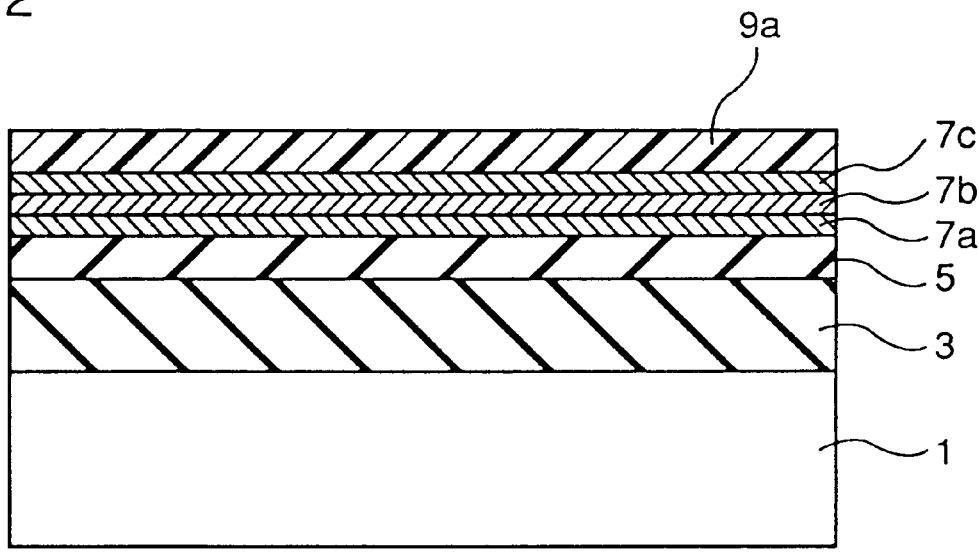
FIGS. 12–17 are schematic cross sections showing the first through the sixth process steps of the method of manufacturing a phase shift mask according to the first embodiment of the present invention.

With reference to FIG. 12, silicon nitride film 3, silicon oxide film 5, a chromium oxide (CrO) film 7a, a chromium (Cr) film 7b, a chromium oxide film 7c, and EB (Electron Beam) resist 9a are successively formed on the surface of transparent substrate 1 formed of quartz.

Silicon nitride film 3 is formed by LPCVD method at a temperature of 600–800° C. to the thickness of 1570±47 Å. Silicon nitride film 3 may be formed by plasma CVD method at a temperature of 250–450° C.

Silicon oxide film 5 is formed by LPCVD method at a temperature of, for example, 600–800° C. to the thickness of 240±108 Å. Silicon oxide film 5 may be formed by plasma CVD method at a temperature of 250–450° C.

Chromium oxide film 7a, chromium film 7b, chromium oxide film 7c, and EB resist 9a are respectively formed, for example, to have the film thicknesses of 300 Å, 800 Å, 300 Å, and 5000 Å. The blanks for a phase shift mask is thus provided.

Figure 13:
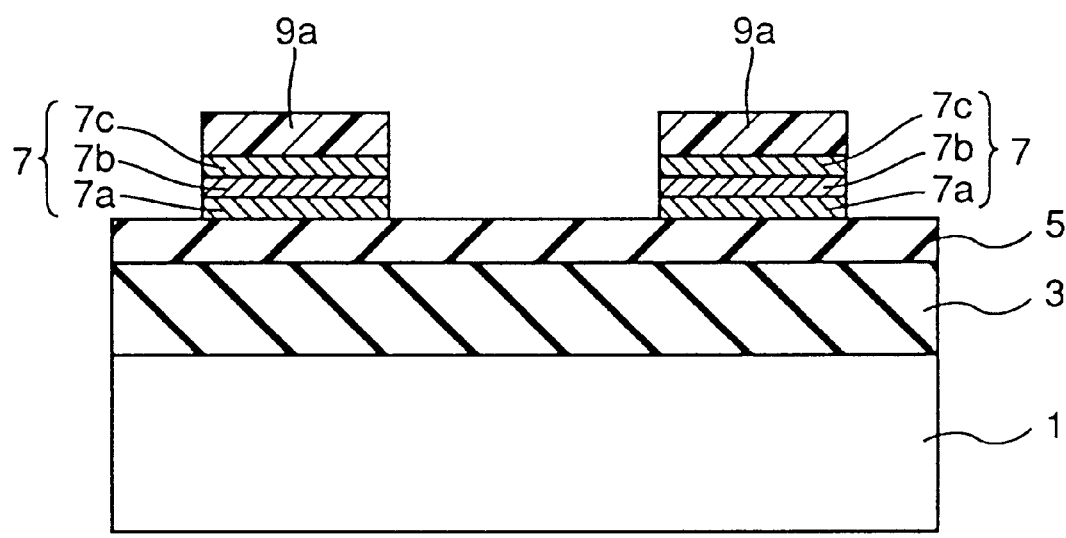

Referring to FIG. 13, a resist pattern 9a corresponding to a light blocking pattern is formed by EB lithography. Three layers of chromium films 7a, 7b and 7c are patterned through the wet etching using resist pattern 9a as a mask and a light blocking pattern 7 is provided. Resist pattern 9a is thereafter removed, then any defect of light blocking pattern 7 is inspected and repaired.

Figure 14:
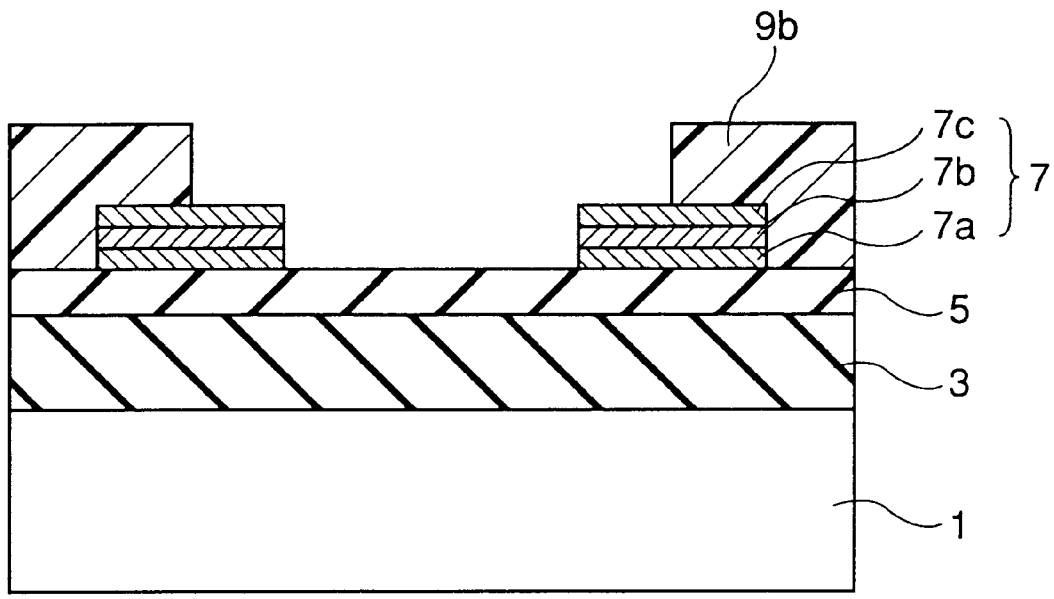

With reference to FIG. 14, an EB resist 9b is applied and patterned by EB lithography in order to form a phase shifter.

Figure 15:
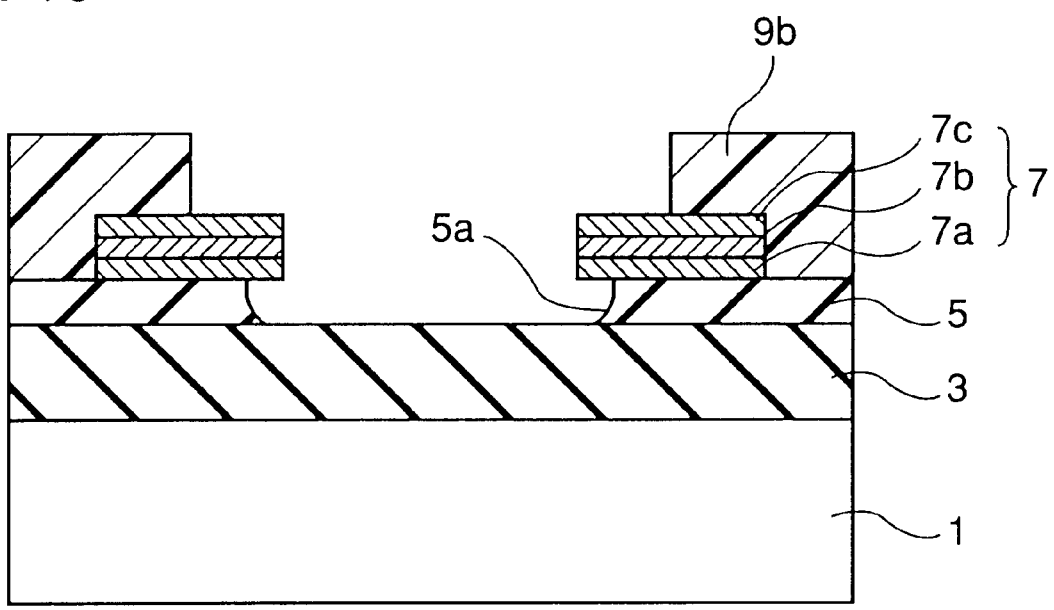

Referring to FIG. 15, silicon oxide film 5 undergoes wet etching by buffer hydrogen fluoride (HF) solution using EB resist 9b and light blocking pattern 7 as masks. The surface of silicon nitride film 3 is exposed and silicon oxide film 5 contacted with the bottom surface of light blocking pattern 7 is removed, so that a sidewall 5a of silicon oxide film 5 has a round shape.

Figure 16:
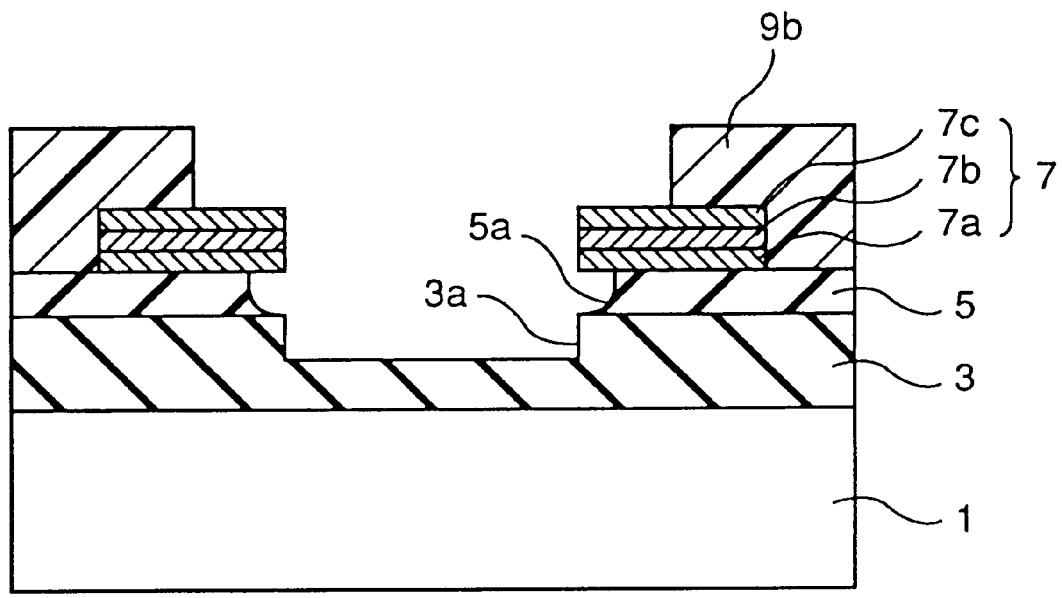

With reference to FIG. 16, the surface of the exposed silicon nitride film 3 is anisotropically etched by CF type RIE (Reactive Ion Etching) using mixed gas such as $CHF_3$, $O_2$, Ar or mixed gas of $CHF_3$, $CO_2$, Ar. The etching is stopped such that the remaining film is left 0.02–0.04 μm in thickness from the surface of transparent substrate 1. A trench 3a is formed in silicon nitride film 3 through this etching. EB resist pattern 9b is thereafter removed.

The inner surface of trench 3a is isotropically etched using so called heated phosphoric acid which is generated by heating the solution of phosphoric acid of 87% of $H_3PO_4$ (phosphoric acid) and 13% of $H_2O$ to 160° C.

Figure 17:
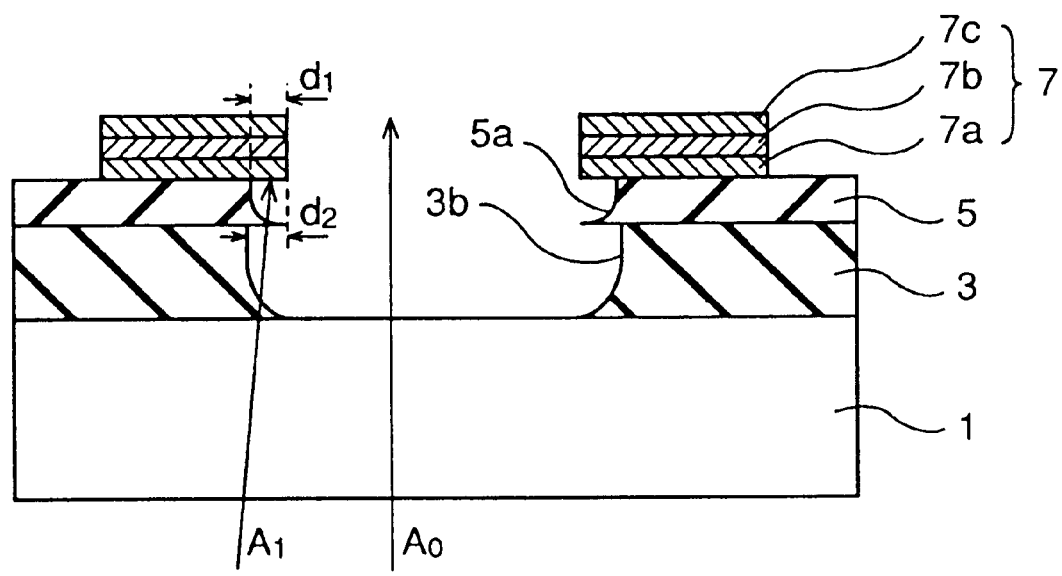

Referring to FIG. 17, the surface of transparent substrate 1 is exposed, and silicon nitride film 3 in contact with the bottom surface of silicon oxide film 5 is removed through this etching. A sidewall 3b of silicon nitride film 3 has a rounded shape accordingly. A defect inspection and repairing of the shifter are carried out and the phase shift mask is completed.

Characteristics of the method of manufacturing will be next described.

According to this manufacturing method, silicon nitride film 3 is used instead of alumina as shown in FIG. 12. Silicon nitride film 3 can be formed by CVD at a temperature of 1000° C. or less. The large melted material dropping on transparent substrate 1 found when alumina is formed by sputtering is never found if silicon nitride film 3 is employed. The distortion of transparent substrate 1, generated by forming alumina through CVD at a high temperature of 1000° C. or more, can be prevented. A phase shift mask of fewer defects and higher resolution can be obtained accordingly.

According to this manufacturing method, wet etching using heated phosphoric acid is employed in the process steps shown in FIG. 16 and FIG. 17. The heated phosphoric acid has high etching selectively (>1000) for the silicon nitride film with respect to the silicon oxide film (SiN/SiO). In wet etching of silicon nitride film 3 by the heated phosphoric acid, transparent substrate 1 functions as an ideal etching stopper. It is sufficient to use only silicon nitride film 3 in order to accurately stop the etching, different from the case in which RIE of high etching selectively is utilized. Phase error caused by the small etch selectively is prevented. A highly precise phase shift mask can be provided accordingly.

As illustrated in FIG. 17, sidewall 3b of silicon nitride film 3 is recessed from the edge of light blocking pattern 7 toward the lower side of blocking pattern 7 by dimension $d_2$ due to the wet etching by the heated phosphoric acid. Transmitted light $A_1$ directed obliquely through shifter layers 3 and 5 having a phase which cancels transmitted light $A_0$ is blocked by light blocking pattern 7. The degradation of the intensity of the transmitted light can be avoided since transmitted light $A_0$ is never cancelled by obliquely directed transmitted light $A_1$. The appropriately selected amount of etching by the heated phosphoric acid would make this effect more obvious.

Figure 18:
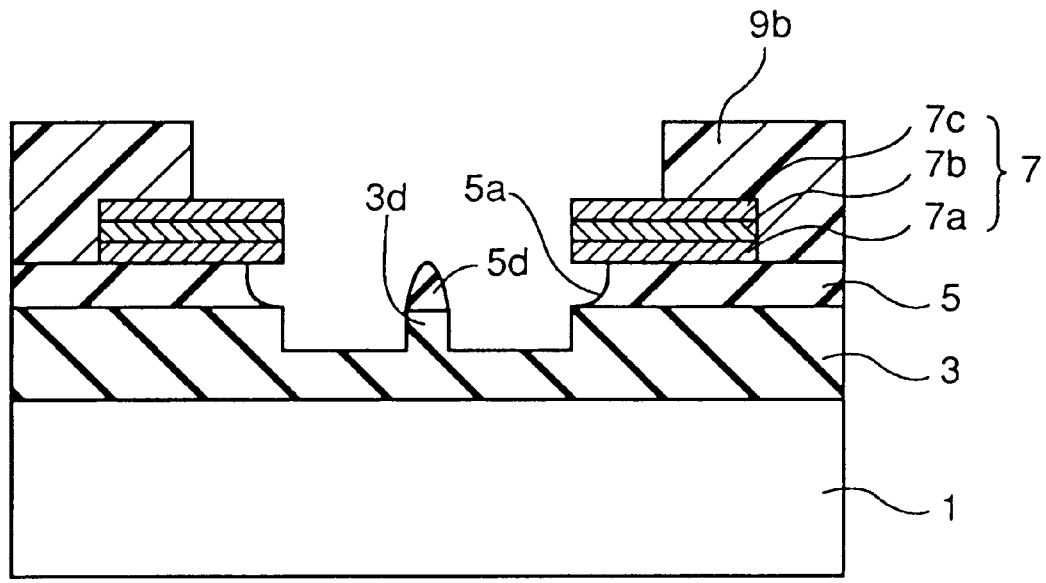
FIGS. 18 and 19 respectively illustrate the first and the second process steps in which the residual defect can be easily removed following the method of manufacturing a phase shift mask according to the first embodiment of the invention.
Figure 19:
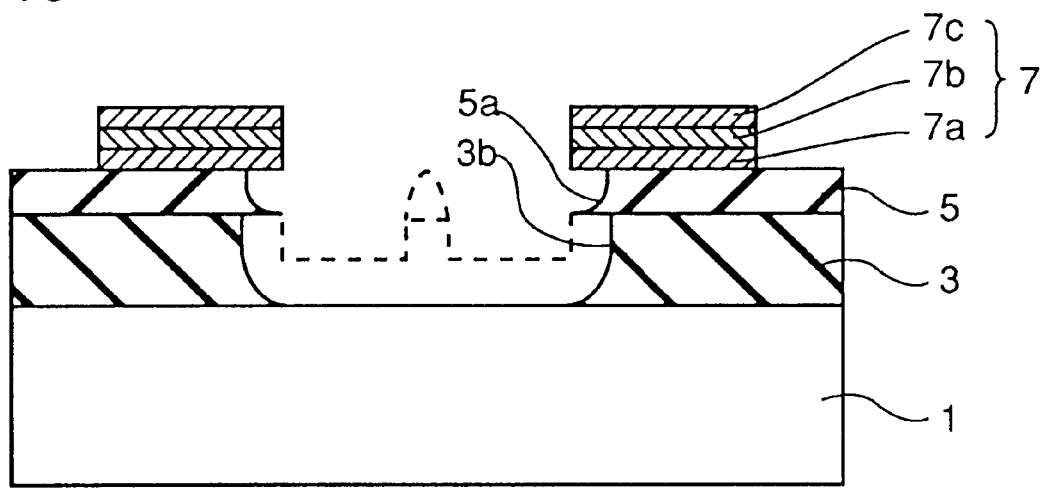

As shown in FIG. 18, if a remaining material 5d such as contamination is left at the time of etching of silicon oxide film 5, for example, a shifter residual defect 3d is generated when silicon nitride film 3 is anisotropically etched. However, this minute shifter residual defect 3d can be automatically removed through isotropic etching by the heated phosphoric acid as shown in FIG. 19. The number of the defects found prior to the completion of the process (inspection/repair) can dramatically be decreased.

Second Embodiment

Figure 20:
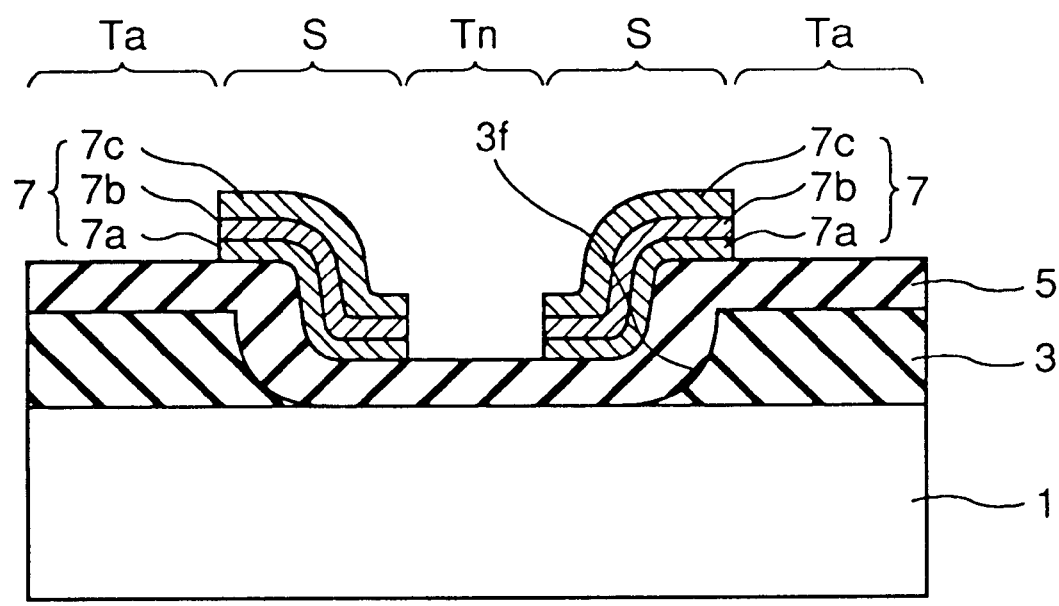
FIG. 20 is a schematic cross section showing the structure of the phase shift mask according to the second embodiment of the present invention.

With reference to FIG. 20, silicon nitride film 3 is formed on the surface of transparent substrate 1 to cover the first transmitting region Ta and to expose the second transmitting region Tn. A sidewall 3f of silicon nitride film 3 has a rounded shape. Silicon oxide film 5 is formed to cover silicon nitride film 3 in the first light transmitting region Ta and to cover the surface of transparent substrate 1 in the second light transmitting region Tn. Light blocking film 7 is provided to cover transparent substrate 1 in light blocking region S sandwiched between the first light transmitting region Ta and the second light transmitting region Tn. Light blocking film 7 is constituted by the stacked three layers of oxide chromium film 7a, chromium film 7b and oxide chromium film 7c.

When i-line is employed as exposure light, the film thickness of silicon nitride film 3 is set to 1680±47 Å and that of silicon oxide film 5 is set to 650±150 Å. When KrF eximer light is used as exposure light, the film thickness of silicon nitride film 3 is set to 980±26 Å and that of silicon oxide film 5 is set to 420±100 Å. It is noted that the film thickness is obtained in the similar manner as in the first embodiment.

By defining the film thickness of silicon nitride film 3 and silicon oxide film 5 as above, a phase shift mask can be obtained in which the amount of light transmitted in the first and the second light transmitting region Ta and Tn is almost identical and the phase difference of each light transmitted through the first and the second light transmitting region Ta and Tn is substantially 180°.

As described in the first embodiment, the decrease of the sum of the thickness of silicon nitride film 3 and silicon oxide film 5 allows the smaller phase error due to overetching, prevents peeling of the pattern during the process such as cleaning, and decreases the amount of the transmitted light owing to the geometric effect.

A method of manufacturing a phase shift mask according to this embodiment will be described.

Figure 21:
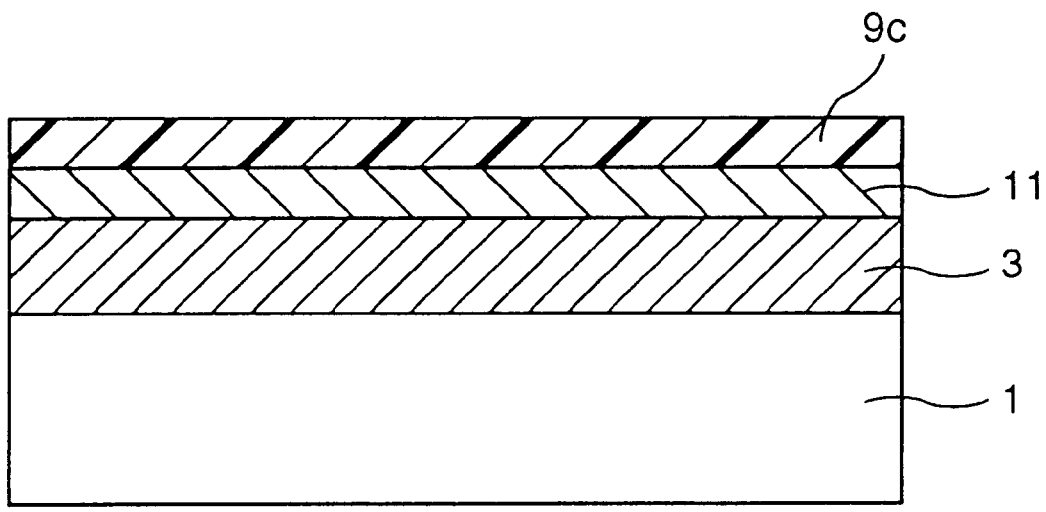
FIGS. 21 to 24 are schematic cross sections illustrating the first through the fourth process steps of the method of manufacturing a phase shift mask according to the second embodiment of the invention.

With reference to FIG. 21, silicon nitride film 3, a chromium film 11 and EB resist 9c are successively deposited on quartz substrate 1. Silicon nitride film 3 is formed by LPCVD method at a temperature of, for example, 600–800° C. to the thickness of 1680±47 Å. Silicon nitride film 3 may be formed by plasma CVD method at a temperature of 250–450° C. Chromium film 11 is formed to the thickness of 1000 Å, for example, and EB resist 9c is formed to the thickness of 5000 Å.

A blank for a phase shift mask is thus provided.

EB resist 9c is patterned through EB lithography. Chromium film 11 undergoes wet etching using this resist pattern as a mask. An impurity doped silicon film may be formed to the thickness of 1000 Å instead of chromium film 11. Resist pattern 9c is thereafter removed and any defect of chromium film is repaired.

Figure 22:
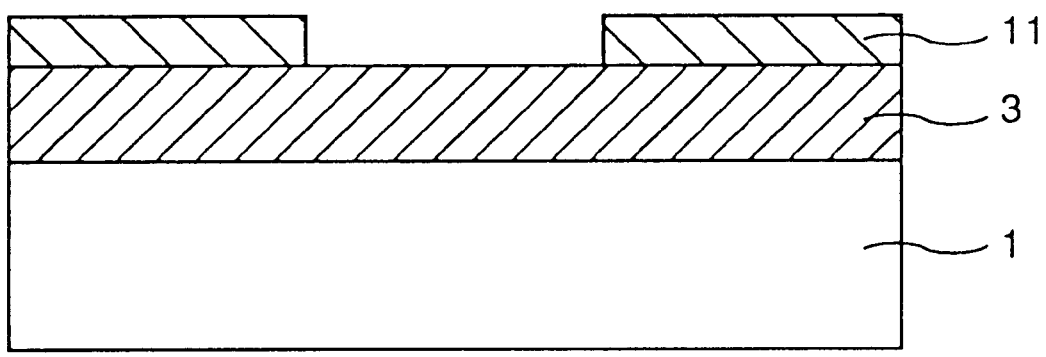

Referring to FIG. 22, chromium film pattern 11 is formed through above described wet etching. Silicon nitride film 3 undergoes the wet etching by so called heated phosphoric acid using this chromium film pattern 11 as a mask.

Figure 23:
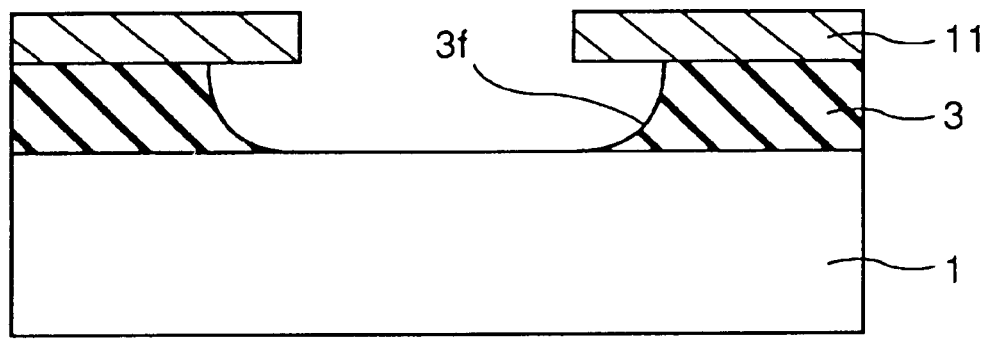

Referring to FIG. 23, silicon nitride film 3 is removed by the wet etching to expose the surface of transparent substrate 1 and to be recessed from chromium film pattern 11. Accordingly, sidewall 3f of silicon nitride film 3 has a rounded shape. Slight etching is carried out using diluted hydrogen fluoride ($\leq 100$ Å). The purpose of this etching is to correct the phase error due to variation in film thickness generated through the formation of silicon nitride film 3.

The entire chromium film pattern 11 is thereafter removed by wet etching.

Figure 24:
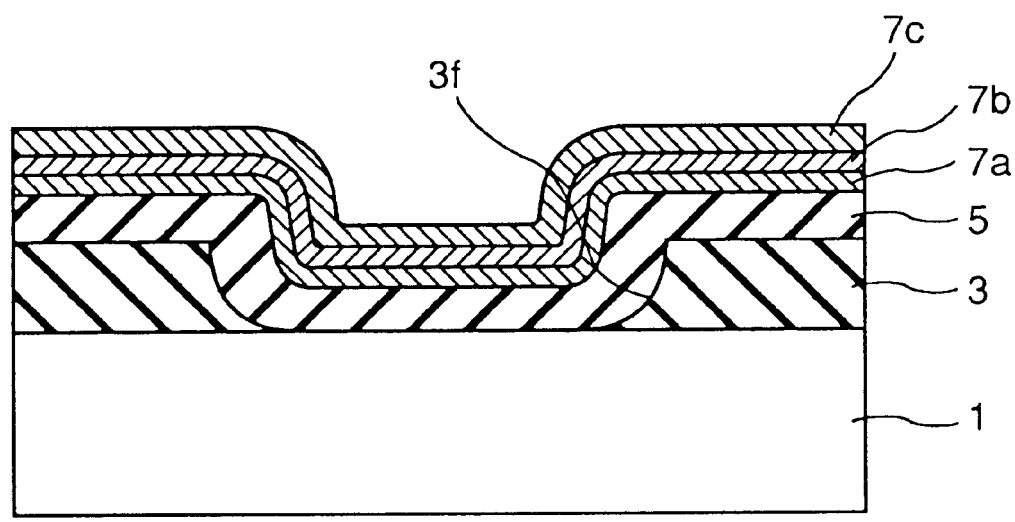

With reference to FIG. 24, silicon oxide film 5 is formed by LPCVD method at a temperature of, for example, 600–800° C. to have film thickness of 650±150 Å. Silicon oxide film 5 may be formed by plasma CVD method at a temperature of 250–450° C. On silicon oxide film 5, oxide chromium film 7a of film thickness 300 Å, chromium film 7b of thickness 800 Å, and oxide chromium film 7c of thickness 300 Å are successively deposited.

After EB resist (not shown) is applied, pattering is performed. Three layers of chromium films 7a, 7b and 7c are patterned through wet etching using this resist pattern as a mask. The resist pattern is thereafter removed, and the defect inspection and repairing of chromium films 7a, 7b and 7c are carried out. Thus, a phase shift mask shown in FIG. 20 is completed.

Characteristics of the method of manufacturing are next presented.

According to the manufacturing method, silicon nitride film 3 is employed instead of alumina as shown in FIG. 21. Silicon nitride film 3 can be formed by CVD method at a temperature which is not very high. Therefore, different from sputtering for forming alumina, the large melted material never drop on transparent substrate 1. The distortion of transparent substrate 1 due to the high temperature of 1000° C. or more is not found different from the case in which alumina is formed by CVD method. Accordingly, a phase shift mask of fewer defects and higher resolution can be obtained.

Wet etching by the heated phosphoric acid is carried out in the process steps shown in FIGS. 22 and 23. As described in the first embodiment, a highly precise phase shift mask can be produced since the wet etching by the heated phosphoric acid is completely stopped at transparent substrate 1.

Figure 25:
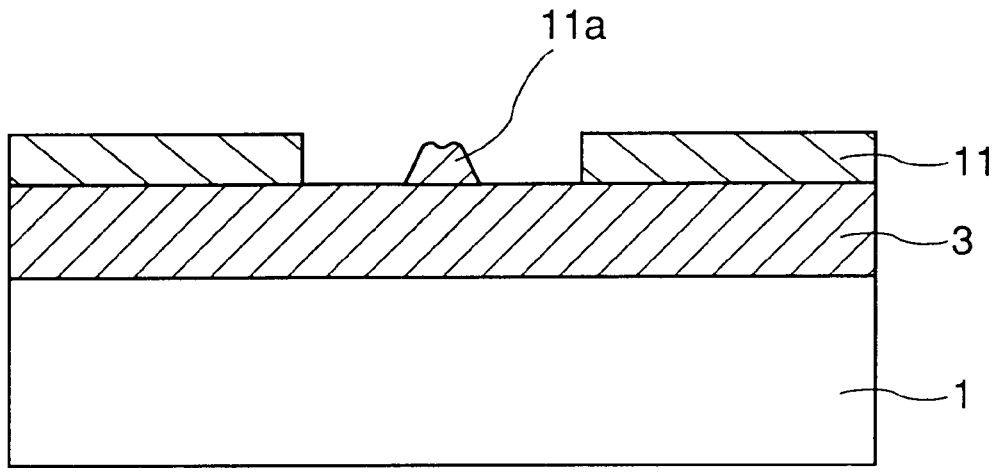
FIGS. 25 and 26 illustrate respectively the first and the second process steps in which the residual defect can be easily removed following the method of manufacturing a phase shift mask according to the second embodiment of the invention.
Figure 26:
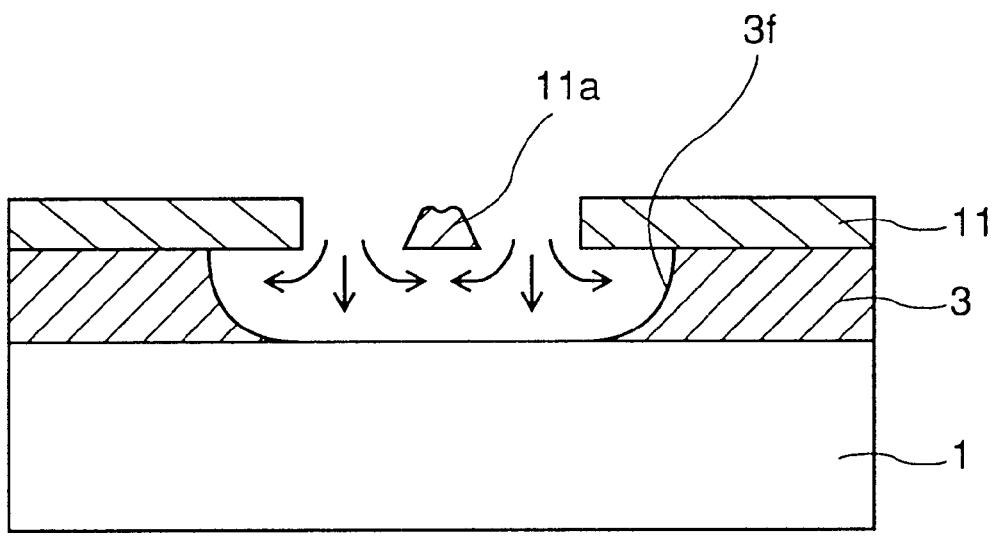
Figure 27A:
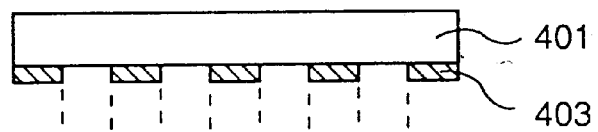
FIG. 27A shows the cross section of the mask when an ordinary photomask is used.
Figure 27B:
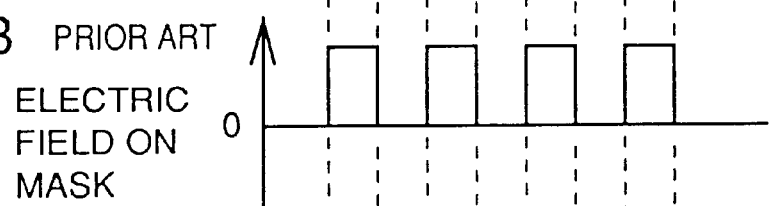
FIG. 27B shows the electric field on the mask.
Figure 27C:
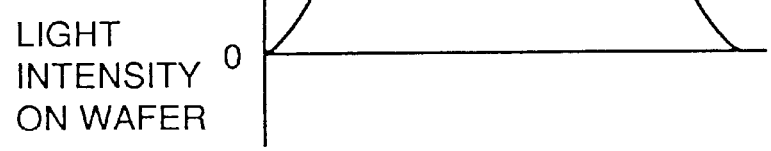
FIG. 27C is a diagram showing the light intensity on the wafer.
Figure 28A:
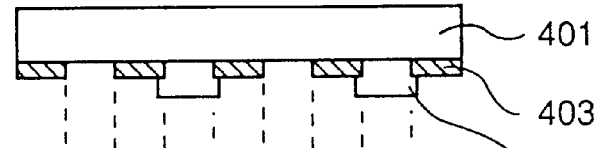
FIG. 28A shows the cross section of the mask when a phase shift mask of the Levenson system is used.
Figure 28B:
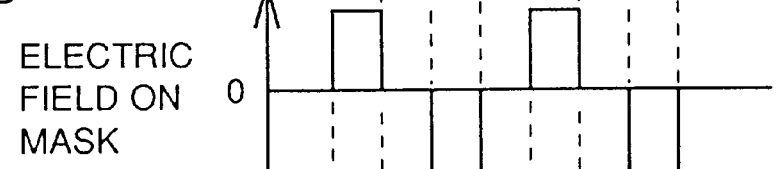
FIG. 28B shows the electric field on the mask.
Figure 28C:
FIG. 28C is a diagram showing the light intensity on the wafer.
Figure 29:
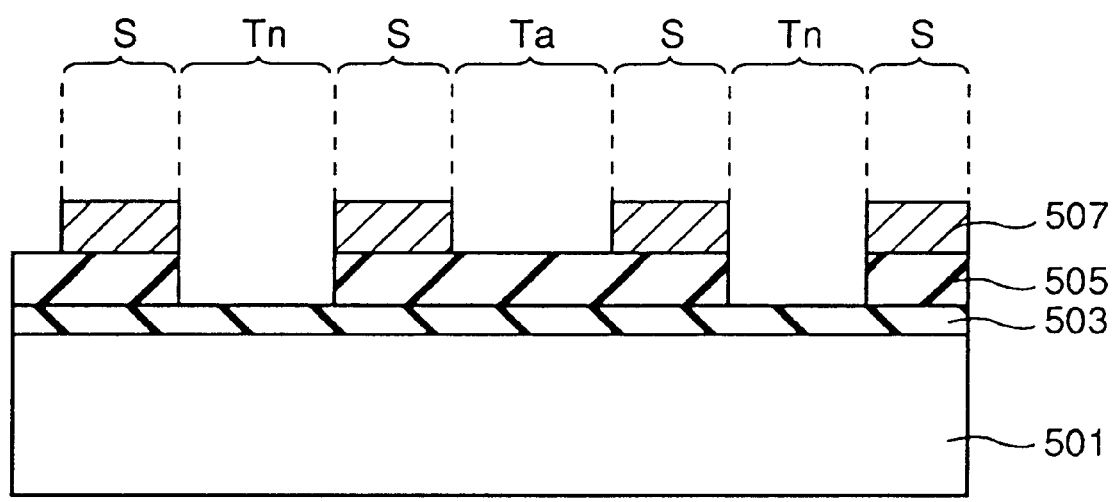
FIG. 29 schematically shows the cross section of the structure of the conventional phase shift mask.
Figure 30:
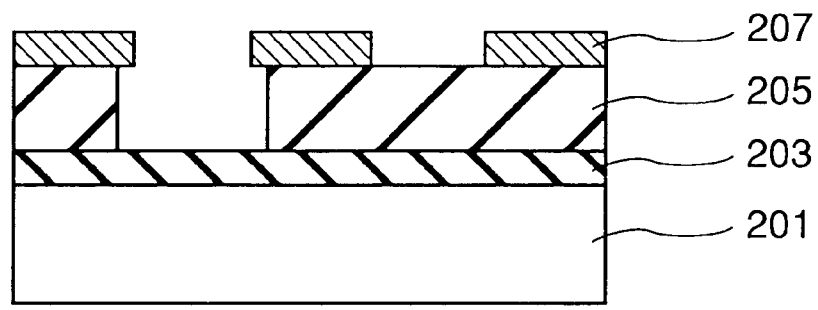
FIG. 30 is a schematic cross section of the phase shift mask described in Japanese Patent Laying-Open No. 7-159971.
Figure 31:
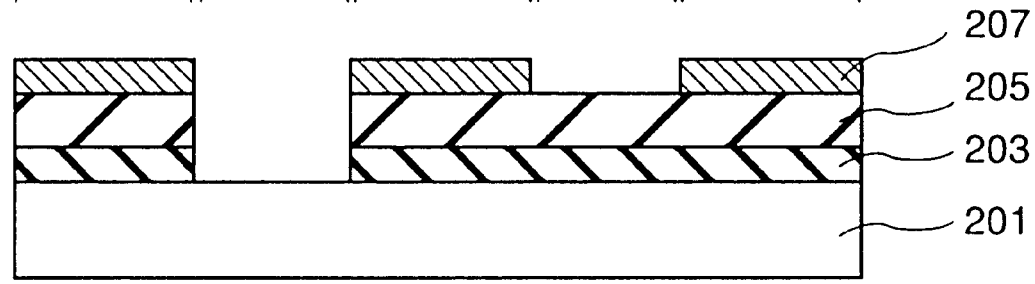
FIG. 31 is a schematic cross section of the phase shift mask described in Japanese Patent Laying-Open No. 7-72612.

There may be a residue 11a such as contamination left at the time of formation of chromium pattern 11 as shown in FIG. 25 through the process steps of FIGS. 21 and 22. When silicon nitride film 3 is anisotropically etched under this condition, silicon nitride film 3 located directly under residue 11a is left and a residual defect of shifter is generated. According to the method of manufacturing in this embodiment, wet etching by the heated phosphoric acid is performed after the anisotropic etching. Thus, silicon nitride film 3 located under residue 11a is also removed as shown in FIG. 26.

In isotropic etching, the etchant reaches well under residue 11a. Silicon nitride film 3 distributed over the region under residue 11a is removed and residue 11a drops from silicon nitride film 3 since there is no underlayer. According to the method of manufacturing in this embodiment, the possibility of the residual defect is rare, then a highly precise phase shift mask and of good resolution can be obtained.

Wet etching by the heated phosphoric acid allows to control the etching at a rate below 1 Å/sec, and the phase error can be corrected with high accuracy.

In the phase shift mask according to the first aspect of the present invention, a silicon nitride film is used instead of alumina. The silicon nitride film can be formed by CVD without setting the temperature very high. Different from the sputtering of alumina, large melted material would never drop on a transparent substrate. The transparent substrate would not distort due to the high temperature of 1000° C. or more, different from the formation of alumina by CVD method. A phase shift mask with fewer defects and higher resolution can be obtained accordingly.

The phases of each light transmitted through light transmitting regions adjacent to each other with a light blocking region interposed are substantially 180° different from each other, and the amount of each light transmitted light can be identical. A highly precise phase shift mask can be obtained accordingly.

In a phase shift mask according to another aspect of the present invention, a silicon nitride film is used instead of alumina as the first aspect of the invention, so that a phase shift mask with fewer defects and higher resolution can be obtained.

Through the proper control of the thickness of the silicon oxide film and the silicon nitride film, the phases of each light transmitted through the light transmitting regions adjacent to each other with a light blocking region interposed differ substantially 180°, and the amount of each transmitted light can be identical. A highly precise phase shift mask can thus be obtained.

By fabricating a phase shift mask using a blank for a phase shift mask in another aspect of the present invention, phase of the light transmitted through the light transmitting regions with a light blocking region interposed differs substantially 180° from each other and the identical amount of the transmitted light can be achieved. A highly precise phase shift mask can thus be obtained.

According to a method of manufacturing a phase shift mask in the first and the other aspects of the present invention, a silicon nitride film is used instead of alumina, so that a phase shift mask with fewer defects and higher resolution can be obtained as described above.

The phases of the light transmitted through the transmitting regions with a light blocking region interposed are substantially 180° different from each other, and the amount of each transmitted light can be identical. A highly precise phase shift mask can be accordingly obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask comprising:
a first light transmitting region through which exposure light is transmitted;
a second light transmitting region through which exposure light having a phase different from that of the exposure light transmitted through said first light transmitting region is transmitted;
a light blocking region interposed between said first light transmitting region and said second light transmitting region;
a transparent substrate having a major surface;
a silicon nitride film formed to cover the major surface of said transparent substrate in said first light transmitting region, thereby exposing the major surface of said transparent substrate in said second light transmitting region, said silicon nitride film having a thickness $t_n$ and a refractive index $n_n$;
a silicon oxide film formed on said silicon nitride film, said silicon oxide film having a thickness $t_0$ and a refractive index $n_0$; and
a light blocking film covering the major surface of said transparent substrate in said light blocking region;
said phase shift mask satisfying the equation:

$$(t_n \times n_n + t_o \times n_o) - (t_n + t_o) = \frac{\lambda}{2} \times m$$

wherein m is an arbitrary positive odd number and λ is a wavelength of said exposure light;
said silicon nitride film thickness and said silicon oxide film thickness being selected to provide substantially equal transmittance through said first and second light transmitting regions.

2. The phase shift mask according to claim 1, wherein:
said silicon nitride film is formed in direct contact with the major surface of said transparent substrate, and
said silicon oxide film is formed in direct contact with said silicon nitride film.

3. The phase shift mask according to claim 1, wherein said arbitrary positive odd number m is 1.

4. The phase shift mask according to claim 1, wherein:
the film thickness and refractive index of said silicon oxide film are respectively 240±108 Å and 1.47±0.03; and
the film thickness and refractive index of said silicon nitride film are respectively 1570±47 Å and 2.09±0.03 when i-line is used as said exposure light.

5. The phase shift mask according to claim 1, wherein:
the film thickness and refractive index of said silicon oxide film are respectively 440±67 Å and 1.51±0.03; and
the film thickness and refractive index of said silicon nitride film are respectively 800±26 Å and 2.27±0.04 when KrF eximer light is used as said exposure light.

6. A phase shift mask comprising:
a first light transmitting region through which exposure light is transmitted;

a second light transmitting region through which exposure light having a phase different from that of the exposure light transmitted through said first light transmitting region is transmitted;

a light blocking region interposed between said first light transmitting region and said second light transmitting region;

a transparent substrate having a major surface;

a silicon nitride film formed to cover the major surface of said transparent substrate in said first light transmitting region, exposing the major surface of said transparent substrate in said second light transmitting region, said silicon nitride film having a thickness $t_n$ and a refractive index $n_n$;

a silicon oxide film formed on said silicon nitride film to cover the major surface of said transparent substrate in said first light transmitting region and to cover the major surface of said transparent substrate in said second light transmitting region, said silicon oxide film having a thickness $t_o$ and a refractive index $n_o$; and a light blocking film covering the major surface of said transparent substrate in said light blocking region;

said phase shift mask satisfying the equation:

$$t_n \times n_n - t_n = \frac{\lambda}{2} \times m$$

wherein m is an arbitrary positive odd number and $\lambda$ is a wavelength of said exposure light;

said silicon nitride film thickness and said silicon oxide film thickness being selected to provide substantially equal transmittances through said first and second light transmitting regions.

7. The phase shift mask according to claim 6, wherein:

the film thickness and refractive index of said silicon oxide film are respectively 650±150 Å and 1.47+0.03; and the film thickness and refractive index of said silicon nitride film are respectively 1680±47 Å and 2.09±0.03 when i-line is used as said exposure light.

8. The phase shift mask according to claim 6, wherein:

the film thickness and refractive index of said silicon oxide film are respectively 420±100 Å and 1.47±0.03; and the film thickness and refractive index of said silicon nitride film are respectively 980±26 Å and 2.27±0.04 when KrF eximer light is used as said exposure light.

9. A blank for a phase shift mask comprising:

a first light transmitting region through which exposure light is transmitted:

a second light transmitting region through which exposure light having a phase different from that of the exposure light transmitted through said first light transmitting region is transmitted;

a light blocking region interposed between said first light transmitting region and said second light transmitting region;

a transparent substrate having a major surface;

a silicon nitride film formed in direct contact with the major surface of said transparent substrate;

a silicon oxide film formed in direct contact with said silicon nitride film; and a light blocking film formed in direct contact with said silicon oxide film;

said blank satisfying the equation:

$$(t_n \times n_n + t_o \times n_o) - (t_n + t_o) = \frac{\lambda}{2} \times m$$

wherein m is an arbitrary positive odd number, $t_n$ and $n_n$ are film thickness and refractive index of said silicon nitride film, respectively, $t_o$ and $n_o$ are film thickness and refractive index of said silicon oxide film, respectively, and $\lambda$ is a wavelength of said exposure light;

said silicon nitride film thickness and said silicon oxide film thickness being selected to provide substantially equal transmittance through said first and second light transmitting regions.

10. The blank for a phase shift mask according to claim 9, wherein said arbitrary positive odd number m is 1.

11. The blank for a phase shift mask according to claim 9, wherein:

the film thickness and refractive index of said silicon oxide film are respectively 240±108 Å and 1.47±0.03; and the film thickness and refractive index of said silicon nitride film are respectively 1570±47 Å and 2.09±0.03 where i-line is used as said exposure light.

12. The blank for a phase shift mask according to claim 9, wherein:

the film thickness and refractive index of silicon oxide film are respectively 440±67 Å and 1.51±0.03; and the film thickness and refractive index of said silicon nitride film are respectively 800±26 Å and 2.27±0.04 when KrF eximer light is used as said exposure light.

13. A method of manufacturing a phase shift mask having a first light transmitting region through which exposure light is transmitted, a second light transmitting region through which exposure light having a phase different from that of the exposure light transmitted through said first light transmitting region is transmitted, a light blocking region interposed between said first light transmitting region and said second light transmitting region, the method comprising the steps of:

forming a silicon nitride film on a major surface of a transparent substrate;

forming a silicon oxide film on said silicon nitride film;

forming a light blocking film to cover said silicon oxide film in said light blocking region and to expose said silicon oxide film in said first and said second light transmitting regions;

isotropically etching a surface of said silicon oxide film within said second light transmitting region to expose a surface of said silicon nitride film;

anisotropically etching said exposed surface of the silicon nitride film to form a trench having a bottom wall surface formed from said silicon nitride film;

isotropically etching an inner wall surface of said trench using a heated phosphoric acid solution for exposing a portion of the major surface of said transparent substrate at the bottom wall surface of said trench.

14. The method of manufacturing a phase shift mask according to claim 13, comprising:

forming said silicon nitride film by low pressure CVD at a temperature of 600° C. to 800° C.; and forming said silicon oxide film by low pressure CVD at a temperature of 600° C. to 800° C.

15. The method of manufacturing a phase shift mask according to claim 13, comprising:
- forming said silicon nitride film by plasma CVD at a temperature of 250° C. to 450° C.; and
- forming said silicon oxide film by plasma CVD at a temperature of 250° C. to 450° C.

16. A method of manufacturing a phase shift mask having a first light transmitting region through which exposure light is transmitted, a second light transmitting region through which exposure light having a phase different from that of the exposure light transmitted through said first light transmitting region is transmitted, a light blocking region interposed between said first light transmitting region and said second light transmitting region, the method comprising the steps:
- forming a silicon nitride film on a major surface of a transparent substrate;
- isotropically etching a surface of said silicon nitride film in the second light transmitting region to expose a portion of the major surface of said transparent substrate;
- forming a silicon oxide film to cover said silicon nitride film and to cover the exposed portion of major surface of said transparent substrate in said second light transmitting region; and
- forming a light blocking film to cover said silicon oxide film in said light blocking region and to expose said silicon oxide film in said first and second light transmitting regions.

17. The method of manufacturing a phase shift mask according to claim 16, comprising:
- forming said silicon nitride film by low pressure CVD at a temperature of 600° C. to 800° C.; and
- forming said silicon oxide film by low pressure CVD at a temperature of 600° C. to 800° C.

18. The method of manufacturing a phase shift mask according to claim 16, comprising:
- forming said silicon nitride film by plasma CVD at a temperature of 250° C. to 450° C.; and
- forming said silicon oxide film by plasma CVD at a temperature of 250° C. to 450° C.

* * * * *